US012473642B2

(12) United States Patent
Pimputkar

(10) Patent No.: US 12,473,642 B2
(45) Date of Patent: *Nov. 18, 2025

(54) HIGH PRESSURE SPATIAL CHEMICAL VAPOR DEPOSITION SYSTEM AND RELATED PROCESS

(71) Applicant: Lehigh University, Bethlehem, PA (US)

(72) Inventor: Siddha Pimputkar, Bethlehem, PA (US)

(73) Assignee: Lehigh University, Bethlehem, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/425,035

(22) Filed: Jan. 29, 2024

(65) Prior Publication Data

US 2024/0209502 A1 Jun. 27, 2024

Related U.S. Application Data

(63) Continuation of application No. 17/277,742, filed as application No. PCT/US2019/052667 on Sep. 24, 2019, now Pat. No. 11,885,018.

(Continued)

(51) Int. Cl.
C23C 16/455 (2006.01)
C23C 16/30 (2006.01)
(Continued)

(52) U.S. Cl.
CPC ...... *C23C 16/45514* (2013.01); *C23C 16/303* (2013.01); *C23C 16/4584* (2013.01);
(Continued)

(58) Field of Classification Search
CPC ............ C23C 16/303; C23C 16/45514; C23C 16/45591; C23C 16/4584; C30B 25/10; C30B 25/12; C30B 25/14; C30B 29/406
See application file for complete search history.

(56) References Cited

U.S. PATENT DOCUMENTS 4,579,080 A 4/1986 Martin et al.
6,143,077 A 11/2000 Ikeda et al.
(Continued)

OTHER PUBLICATIONS

Nikolaus Dietz, Stabilization of Indium-Rich IN1-XGAXN Heterostructures—The Exploration of a C (Report); retrieved Apr. 12, 2021; pp. 1-33.
(Continued)

*Primary Examiner* — Matthew J Song
(74) *Attorney, Agent, or Firm* — The Belles Group, P.C.

(57) ABSTRACT

High pressure spatial chemical vapor deposition apparatuses and related process are disclosed for forming thin films on a substrate. An enclosure includes plural process chambers fluidly isolated from each other by radial separating barriers. Each chamber contains a different source gas comprising volatile reactive species. The substrate is supported beneath the chambers on a rotating heated susceptor. Rotation of the susceptor carries the substrate in a path which consecutively exposes the substrate to the volatile reactive species in each process chamber. The gases first mix in the gaseous boundary layer formed adjacent the substrate. A thin film gradually grows in thickness on the substrate with each successive pass and exposure to the reactive species in each process chamber. The tool pressure and boundary layer thickness may be dynamically varied during the film formation process run via a programmable controller to alter the film composition and features formed on the substrate.

19 Claims, 21 Drawing Sheets

Related U.S. Application Data

(60) Provisional application No. 62/735,309, filed on Sep. 24, 2018.

(51) Int. Cl.
*C23C 16/458* (2006.01)
*C30B 25/10* (2006.01)
*C30B 25/12* (2006.01)
*C30B 25/14* (2006.01)
*C30B 29/40* (2006.01)
*H01L 21/02* (2006.01)
*H01L 21/687* (2006.01)

(52) U.S. Cl.
CPC ............. *C30B 25/10* (2013.01); *C30B 25/12* (2013.01); *C30B 25/14* (2013.01); *C30B 29/406* (2013.01); *H01L 21/0254* (2013.01); *H01L 21/0262* (2013.01); *H01L 21/68764* (2013.01)

(56) References Cited

U.S. PATENT DOCUMENTS

| | | | |
|---|---|---|---|
| 10,358,743 | B2 | 7/2019 | Dietz |
| 11,885,018 | B2 * | 1/2024 | Pimputkar ............. C30B 25/14 |
| 2006/0005856 | A1 | 1/2006 | Sun et al. |
| 2015/0361553 | A1 * | 12/2015 | Murakawa ........ C23C 16/45561 156/345.55 |
| 2016/0024653 | A1 | 1/2016 | Forster et al. |
| 2017/0029947 | A1 * | 2/2017 | Kawahara ......... H01L 21/67167 |
| 2018/0261480 | A1 | 9/2018 | Liang et al. |

OTHER PUBLICATIONS

Nikolaus Dietz, High-pressure CVD growth of InN and indium-rich group III-nitride compound semiconductors for novel mid- and far-infrared detectors and emitters; (Report); retrieved Apr. 12, 2021; pp. 1-25.

M. K. Indika Senevirathna et al., Effect of reactor pressure on the electrical and structural properties of InN epilayers grown by high-pressure chemical vapor deposition (Journal); Retrieved Apr. 12, 2021; pp. 1-7. (Published Online: Apr. 26, 2012).

Mustafa Alevli et al., Effect of reactor pressure on optical and electrical properties of InN films grown by high-pressure chemical vapor deposition (Article); Retrieved Apr. 12, 2021; pp. 1-7. (Published online Mar. 30, 2015).

Daisuke Iida et al., Growth of GaInN by Raised-Pressure Metalorganic Vapor Phase Epitaxy (Article); Retrieved Jan. 4, 2021; pp. 1-3.

* cited by examiner

HIGH PRESSURE SPATIAL CHEMICAL VAPOR DEPOSITION SYSTEM AND RELATED PROCESS

CROSS-REFERENCE TO RELATED APPLICATIONS

The present application is a continuation-in-part of U.S. patent application Ser. No. 17/277,742 filed Mar. 19, 2021, which is a U.S. national stage application under 35 U.S.C. § 371 of PCT International Application No. PCT/US2019/052667 filed Sep. 24, 2019, which claims the benefit of priority to U.S. Provisional Application No. 62/735,309 filed Sep. 24, 2018; the entireties of which are incorporated herein by reference.

BACKGROUND OF THE INVENTION

The present invention relates to a system and method of producing materials in an epitaxial fashion from the gas phase.

Semiconductors form the foundation of a wide variety of technologies that have made a large scale impact on society. One of the key methods of their production includes synthesis (or growth) using gas phase chemistries. This has had a significant impact as this method permits growth of precise alloy compositions in unary, binary, ternary and higher alloys, along with exceptional control over minute concentration of impurities (down to ppm and ppb levels) enabling a plethora of devices due to controlled growth of materials with desired properties. A widely used commercial platform to synthesis these materials includes chemical vapor deposition (CVD). This method delivers the constituents of the material in gas phase to a carrier wafer or substrate which is typically held at high temperature. The gas molecules react with the surface and/or decompose leading to certain elements remaining on the surface and being incorporated into the growing crystal in an epitaxial fashion forming a crystalline layer on the wafer substrate.

Due to the elevated temperature of the wafer or substrate, the desired material typically improves in crystal quality due to increased mobility of the adatoms on the surface, though simultaneously can lead to degradation of the material due to increased equilibrium vapor pressures of one or more constituents of the growing solid. For materials that are not very stable or are metastable under growth condition, elevated temperature can lead to loss of the high vapor pressure element or could even lead to complete decomposition of the material, i.e. the material is not within the acceptable growth window and the desired material with desired alloy composition cannot be synthesized.

An example of a wide-spread and exceptionally important semiconductor includes Group III-nitrides (InGaN, BGaN, BAlN, BInN, AlGaN, and AlInN) These nitride materials are used for white (or colored) LED, and blue and green laser applications along with power electronics. These materials exhibit a wide-band gap enabling novel applications in both optoelectronic and electronic devices. The challenge with their synthesis is the great stability of GaN and AlN contrasted with the relative instability of InN. Growth of GaN and AlN requires elevated temperatures of up to ~1000° C. for GaN and >1200° C. for AlN. InN however typically requires lower temperatures such as 500-700° C., above which InN decomposes into metallic In and nitrogen, and as such does not undergo incorporation into the crystal. Higher concentrations of indium are highly desired for BInN, AlInN and InGaN as it permits access to band bap regimes that are extremely challenging to access using other growth methods. No scalable method has yet been found to access the entire ternary alloy window regime for commercialization.

SUMMARY OF THE INVENTION

The following invention provides a high pressure spatial CVD (HPS-CVD) system which overcomes the shortcomings in the state in the art for growing/synthesizing (single) crystals of decomposition limited materials. As such, the system comprises a new specially-configured CVD equipment or tool design (i.e. reactor) and related process/method which advantageously permits growth of as of yet unspecified materials on a substrate. In one embodiment, the substrate may be a wafer as used in the formation of semiconductors and associated devices. However, the invention is not limited in use and may be employed for depositing other type films on substrates unrelated to semiconductors such as for magnetic materials, scintillators, etc., nor should it been seen as limiting to use nitrogen as the dominant material constituent and alternative material systems include oxides, boronitrides, carbonitrides, selenides, telluride, etc.

The current invention overcomes existing challenges in CVD tool design by creating a process or method for growing crystals on a wafer at elevated pressures; a first key aspect of present HPS-CVD system. These elevated pressures includes growth at pressures greater than 1 atm (atmospheres) and up to and including 1000 atm. Elevated pressures permit growth of crystals at higher vapor pressures, leading to elevated growth temperatures without associated decomposition. In the example of InGaN, it is predicted that growth of InN can occur at the same temperature as GaN if a total system pressure of about 70 atm is provided. The proposed reactor (HPS-CVD) is expected to enable the growths of both high Indium-content BInN, AlInN, InGaN and InN at compatible growth conditions, which will in turn open up the avenues for heterostructure engineering in these material systems for emitters, high speed transistors, and solar cells.

To further overcome the limitations in the state of the art, the entire CVD reactor tool system is redesigned in a novel fashion to spatially separate or isolate the source gases and precursor materials; a second key aspect of the present HPS-CVD system. The system design permits and enables crystal growth at elevated pressures by spatially separating the individual source gases while providing independent control of the gaseous reactive mixing or boundary layer thickness above the crystal. In one embodiment, the boundary layer thickness may be controlled mechanically/physically by setting spatial relationships in the tool between the heated susceptor supporting the wafer and separating barriers interspersed between a plurality of individual reactive gas source process chambers in one portion of the reactor such as the hood or head which keeps the reactant gas chemistries in each chamber fluidly isolated from each other. This contrasts with conventional approaches using process parameters alone to control boundary layer thickness such as rotation speed of the wafer, gas flow rates and direction, etc. used heretofore. By uncoupling the need to control thickness of the boundary layer with process parameters, the present HPS-CVD system advantageously allows the process parameters to instead be used for controlling and optimizing other important aspects of the CVD process such as uniformity of the thin layer or film being deposited and grown on the wafer and homogeneity of the film composition. The present system enables the growth of novel material alloys from the chemical vapor phase and permits growing novel optoelectronic or electronic devices such as for example the III-N wide-band gap semiconductor system, including AlInGaN.

The proposed HPS-CVD system and process advantageously enables epitaxial growth of novel functional materials which cannot be grown as they decompose under typically accessible standard CVD process conditions. The present HPS-CVD process addresses challenges related to fluid dynamics, thermodynamics, and mass transport. Precursor materials necessary to grow the desired material are spatially separated and fluidly isolated in individual process chambers of the reactor or tool to prevent pre-reactions during the thin film growth process. The precursors may include without limitation metal species, metal-organic species, and/or various elements and molecules necessary to produce the desired thin film chemical composition. The wafer is heated and rotated in close proximity to the process chambers each having a unique and different or desired gas chemistry. The chambers are arranged in a circular array in the tool head. The entire wafer is preferably exposed to the different reactant gases in each process chamber in a cyclical/sequential manner as it rotates in close proximity to and beneath the chamber in the present orientation of the non-limiting illustrated HPS-CVD tool. The thin film is gradually built up on the wafer to the desired thickness in a uniform manner with each revolution of the wafer in close proximity to the process chambers. Mixing of different precursors contributed by each process chamber which are incorporated into the thin film is achieved in the boundary layer formed above the heated wafer as it is rotated. The gases are only partially reacted when exposed to the wafer with each pass allowing some of the unreacted gas to carry over in the boundary layer to the next succeeding chamber to complete the reaction. As CVD growth proceeds by chemical reactions and incorporation of two or more species in a parallel fashion, as opposed to sequentially, intermixing of the individual sources is necessary. As such, propagation of gases into the boundary layer proceeds predominantly via diffusion from the source chamber and as the wafer proceeds to the next chamber, the gases continue to diffuse down towards the wafer, thereby mixing with the gases from adjacent chambers. As such the abrupt transition between individual gas chambers is smeared out prior to exposure to the wafer. The proposed design uniquely enables specific tailoring of the gas inlets and process chambers for each separate precursor (differing gas densities, composition, and fluid/thermal properties) to optimize its incorporation into the final thin film.

Advantageously, the present invention enables high quality, high efficiency, high growth rate growth of materials using vapor phase sources materials. Operation at high pressures permits growing materials at high temperatures prior to their decomposition or degradation. Spatial separation of the gas/vapor sources minimizes pre-reaction in the gas phase, increasing the utilization of the sources and their incorporation into the growing crystal. The present invention also provides the capability of growing materials which have heretofore been decomposition limited in their growth using the CVD process, meaning high enough temperatures could not be achieved for these materials thereby prohibiting their growth using this class of process techniques.

According to one aspect of the invention, a method for forming a film on a substrate comprises: translating the substrate in a circular path through a material deposition apparatus; and consecutively exposing the wafer to two or more process chambers of the apparatus each containing source gases with one or more volatile reactive species; wherein a film gradually grows in thickness on the substrate with each successive pass and exposure of the substrate to the one or more volatile reactive species from each of the process chambers. In some embodiments, the method may further comprise: growing a thickness of a first film on the substrate at a first higher pressure and corresponding higher growth rate for a first period of time, and growing a thickness of a second film thinner than the first film at a lower second pressure and corresponding lower growth rate for a second period of time.

According to another aspect of the invention, an apparatus for forming thin films on a substrate comprises: the substrate supported on a rotating susceptor; an enclosure defining an internal cavity receiving the substrate; a plurality of process chambers arranged in close proximity to the substrate in the cavity, the process chambers fluidly isolated from each other; each process chamber containing a gas having a composition comprising a different volatile reactive species for deposition on the substrate; wherein rotation of the susceptor carries the substrate in a path which consecutively exposes the substrate to the volatile reactive species in each process chamber; wherein a thin film gradually grows in thickness on the substrate with each successive pass and exposure of the substrate to the volatile reactive species each of the individual process chambers.

According to another aspect of the invention, a modular apparatus for forming thin films on a substrate comprises: the substrate supported on a rotating susceptor; an outer pressure-retention shell defining an internal cavity; a removable first process insert detachably mounted in the internal cavity, the process insert defining a substrate cavity receiving the substrate; a plurality of process chambers arranged above the substrate in the substrate cavity, the process chambers fluidly isolated from each other; each process chamber containing a gas having a composition comprising a different volatile reactive species for deposition on the substrate; wherein rotation of the susceptor carries the substrate in a path which consecutively exposes the substrate to the volatile reactive species in each process chamber; wherein a thin film gradually grows in thickness on the substrate with each successive pass and exposure of the substrate to the volatile reactive species each of the individual process chambers.

According to another aspect of the invention, a process pressure modulation system and related method are provided which can dynamically alter the pressure in the individual process chambers during processing and formation of a nitride or other type film. By increasing the nitrogen, ammonia, hydrazine, or other nitrogen-containing molecule pressure in the system, the stability of the growing nitride film can be stabilized. This permits growth at higher temperature prior to decomposition or modification to defects that emerge during growth. By changing the pressure during a growth, one can advantageously control the stability of these materials in situ during a run and preferentially stabilize or destabilize a material via a pressure increase or decrease, respectively. This is an additional tool, that is much more responsive and quicker to implement than changing the wafer temperature, for example.

According to another aspect of the invention, a process boundary layer modulation system and related method are provided which can dynamically alter the boundary layer thickness in the individual process chambers during processing and formation of a nitride or other type film. Diffusion of precursors through the boundary layer directly determine the properties of the growing material and are tied to the fluid dynamics of the system. It can be advantageous to either rapidly or slowly change the boundary layer thickness via moving the shroud up or the substrate carrier down. The increased distance between the shroud and the wafer carrier can hence provide a higher conductance of the system, leading to an increase in gas flow out of the system, a change in flow pattern going from laminar to turbulent or vice versa, and changing the diffusion time of the precursors through the boundary layer prior to depositing on the surface of the wafer.

BRIEF DESCRIPTION OF THE DRAWINGS

The features of the exemplary embodiments will be described with reference to the following drawings where like elements are labeled similarly, and in which.

Figure 1:
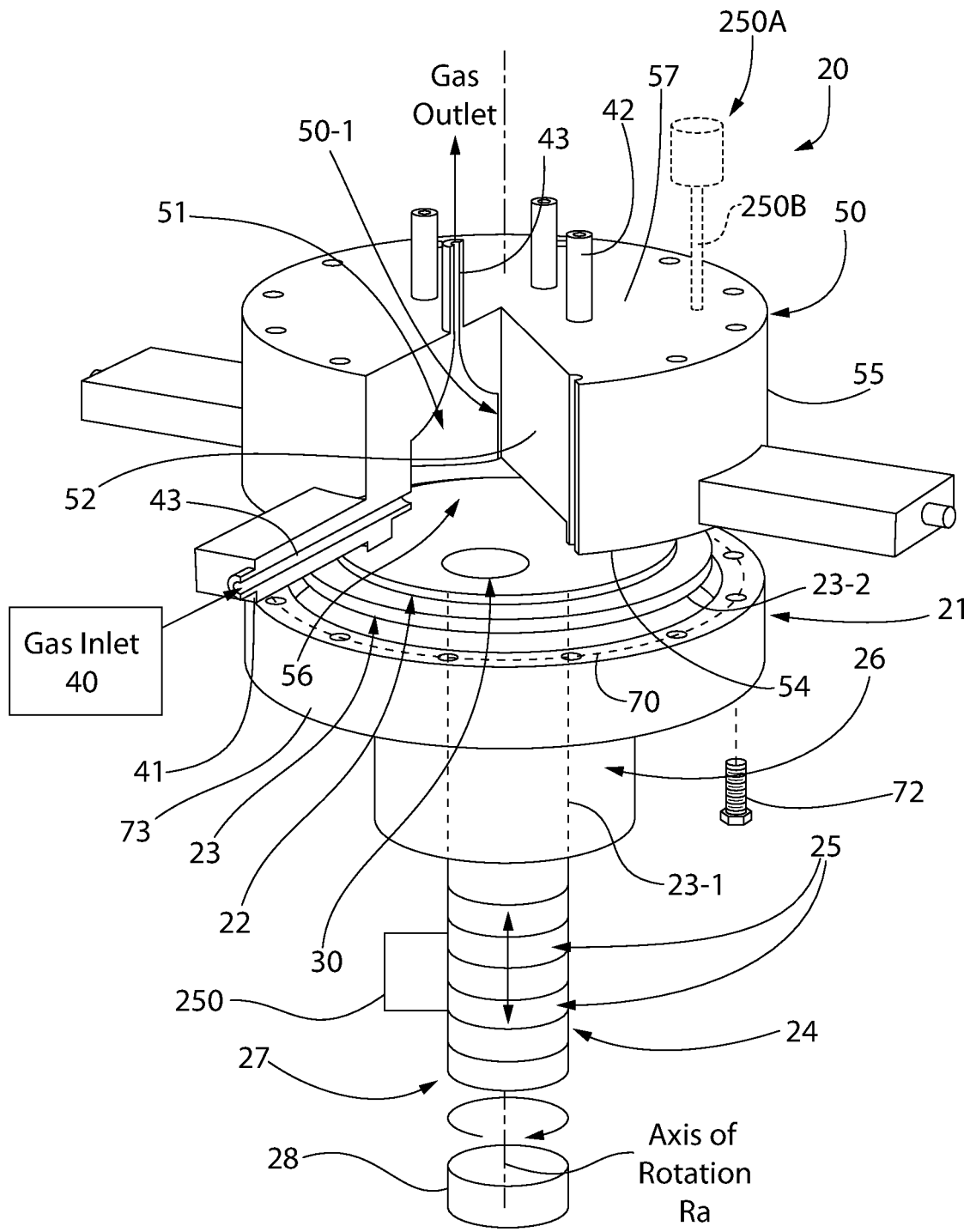
FIG. 1 is a perspective view of a high pressure spatial chemical vapor deposition (HPS-CVD) reactor or tool according to one embodiment of the present disclosure, with a sector cutaway to reveal internal features of the tool.

All drawing shown herein are schematic and not to scale. Parts given a reference number/designation in one figure may be considered to be the same parts where they appear in other figures without that reference number/designation for brevity unless specifically labeled with a different part number/designation and noted herein.

DETAILED DESCRIPTION

The features and benefits of the invention are illustrated and described herein by reference to non-limiting exemplary embodiments. This description of the embodiments is intended to be read in connection with the accompanying drawings, which are to be considered part of the entire written description. Accordingly, the invention expressly should not be limited to such embodiments illustrating some possible non-limiting combination of features that may exist alone or in other combinations of features; the scope of the invention being defined by the claims appended hereto.

In the description of embodiments disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected," "coupled," "interconnected," and similar refer to a relationship wherein structures may be secured or attached to one another either directly or indirectly through intervening structures, as well as both movable or rigid attachments or relationships, unless expressly described otherwise.

As used throughout, any ranges disclosed herein are used as shorthand for describing each and every value that is within the range. Any value within the range can be selected as the terminus of the range. In addition, all references cited herein are hereby incorporated by referenced in their entireties. In the event of a conflict in a definition in the present disclosure and that of a cited reference, the present disclosure controls.

High pressure growth while providing two or more reactive species in the gas phase can be problematic as gas phase pre-reactions can occur. This can happen whenever two reactive species collide in the gas phase. High pressures lead to an increase in collision frequency, which in turn increases the probably that pre-reactions occur leading to loss, and in most cases, complete loss of source material prior to it approaching the surface of the substrate or wafer for incorporation on which the crystal is being formed. Additionally, pre-reacted materials can form solids which proceed to fall on the surface of the growing film thereby introducing defects. This is a major problem with traditional high-pressure CVD tool designs.

The second problem with traditional CVD processes relates to the fluid dynamics of the gas phase above the top surface of the wafer. A well-controlled, thin reaction boundary layer is desired while maintaining a laminar gas flow above the wafer to ensure uniform thickness of the material being deposited thereon. The thickness of the boundary layer is in part determined by the velocity of the gas flowing over the substrate, or in the case of a rotating system, the rotational velocity of the system. A higher rotating speed or higher gas velocity leads to a thinning of the boundary layer thickness. This connection is typically linked suggesting a change in boundary layer thickness is inherently linked to changes in gas flow rates or rotational speed. Additionally, by increasing the pressure, the density of the fluid increases, which in turn leads to a rapid onset of turbulent flow and modification of the boundary layer further complicating matters. Obtaining a relatively thin boundary layer while maintaining laminar flow above the crystal is hence linked with the pressure of the gas and associated gas velocities or rotational speeds. No working solution to decouple gas velocities or rotational speeds with targeted growth conditions can be found in traditional CVD processes beyond a certain pressure.

Combination of these foregoing two concepts in a unique CVD reactor design and process has therefore led to the development of an improved and novel method for forming crystals on a semiconductor substrate such as a wafer. The present process is referred to herein as high pressure spatial CVD (HPS-CVD).

The current invention advantageously overcomes the foregoing process limitations by separating the boundary layer creation above the wafer from the rotational speed of the wafer or speed of the gas flow. Individual separating barriers are placed between adjacent source gas zones defined by a plurality of process chambers in the CVD tool of the present disclosure. The barriers prevent premixing of the reactive gas volatile precursors prior to incorporation into the substrate (e.g. wafer). The height of these separating barriers with respect to the wafer physically/mechanically controls and dictates the thickness of the reactive gas boundary layer in lieu of reliance on process parameters such as wafer rotation speed, gas flow rates, etc. used heretofore. The individual reactive gases are further preferably not premixed upstream of the present CVD tool or reactor to prevent pre-reactions to avoid crystal formation problems on the wafer preceding the gas source process chambers. By spatially transferring the wafer between different reaction zones, the wafer can be sequentially exposed to differing elements and hence a crystal can gradually grow in a uniform manner as the wafer is continuously rotated through the gas source zones to incorporate different molecules of the volatile precursors in the growing crystal layer. In one embodiment of the invention, the wafer can be placed off-center on a disc supported by a pedestal, which is rotated to sequentially expose the wafer to different source gases with unique chemistries in each gas source process chamber. The process chambers are separated from each other by the separating barriers described above and contained in different sectors of the HPS-CVD machine above the rotating disc.

FIGS. 1-4 depict one non-limiting embodiment of a material deposition system comprising a HPS-CVD reactor or tool 20 according to the present disclosure. Component parts of the tool are shown schematically and described in further detail below. Although tool 20 is shown in a vertical orientation with substrate to be processed below the process shroud or hood of the tool for convenience of description only, the tool is expressly not limited for use in this orientation alone. Accordingly, in other embodiments the tool may have numerous other angular orientations for processing the substrate and forming the thin film including for example without limitation in a vertical orientation but completely inverted in position 180 degrees to that shown, horizontal, and a multitude angular positions therebetween relative to both horizontal and vertical reference axes.

HPS-CVD tool 20 comprises a rotating circular heated susceptor 22 comprising a flattened disc-shaped body supported and powered by a motor-driven pedestal 23. Pedestal 23 defines a rotational axis Ra and generally comprises a diametrically widened circular upper support platter 23-2 at top supporting the susceptor and wafer 30 thereon, and a centered downwardly extending cylindrical drive shaft or rotor 27 of smaller diameter in some embodiments. Rotational axis Ra may be vertical and thus aligned parallel to the gravity vector which acts downwards such as in the illustrated embodiment; however, any other suitable orientation of the tool and concomitantly rotational axis Ra may be used relative to the gravity vector in other embodiments (e.g. horizontal and positive or negative angles between horizontal and vertical). Rotor 27 is coupled to electric motor 28 which operates to rotate the pedestal 23. Pedestal 23 may be rotationally supported by an upper portion 21 of a rotationally stationary lower housing 26 of suitable configuration. Housing 26 may be cylindrical in one embodiment and defines a central longitudinal axial passageway 23-1 for rotatably receiving rotor 27 of pedestal 23 therethrough. Platter 23-2 of the pedestal may protrude at least partially above the top of housing 26 and remains exposed for placement of the susceptor 22 thereon. In other embodiments, the platter 23-2 may be recessed into the top of the housing with the top surface of the platter remaining exposed. Lower housing 26 may include high pressure rotating seals and bearings which support the pedestal and guide the rotation of the rotor. The rotor 27 may be equipped with susceptor power leads 25 for energizing the susceptor 22 and insulators 24 for electrically isolating the leads. The susceptor 22 may be heated by radio frequency (RF) induction heating in one embodiment; however, other heating methods of heating the susceptor may be used including electrical resistance heating. Any suitable susceptor material may be used. Some non-limiting examples include but are not limited to graphite, silicon carbide, molybdenum alloys, sapphire, other suitable materials, and combinations thereof.

A substrate, which may be a semiconductor substrate such as a wafer 30 in one non-limiting example on which the crystalline thin epitaxial layer or film is to be formed, is supported on the top surface of the susceptor 22 beneath a stationary pressure retaining hood-like structure, such as the chamber-defining head 50 as shown. The may be considered to define an enclosure in a broader sense. Head 50 may form the pressure retention boundary of the tool 20. In one embodiment, susceptor 22 may be configured and dimensioned to hold a plurality of wafers in an off-center manner which are processed simultaneously for growing epitaxial thin layers or film on the wafer. A crystalline silicon (C—Si), sapphire (($Al_2O_3$), gallium nitride (GaN), aluminum nitride (AlN) or other type material may be used for the wafer substrate which acts as the seed crystal. The choice of seed crystal may vary depending on the composition of thin layers/films to be formed thereon by the present HPS-CVD process.

The head 50 of HPS-CVD tool 20 is configured and constructed to form a hermetically sealed wafer processing environment. In one non-limiting embodiment, the present HPS-CVD process pressures are preferably greater than 1 atm (atmosphere). Head 50 may be structured and formed of a suitable metallic material capable of withstanding high system operating pressures significantly greater than 1 atm (atmosphere) to achieve the film formation benefits previously described herein. In some embodiments, the operating pressure of the HPS-CVD process may be at least 70 atm, and preferably at least 100 atm. Operating pressures in some embodiments are contemplated to be up to and including 1000 atm. The maximum design pressures of the head will therefore be commensurate with the maximum system design operating pressures. Accordingly, the choice of material selected to construct the head 50 and concomitant engineering design parameters (e.g. thickness of materials, etc.) will also depend on the maximum system operating pressures selected. In one embodiment, the head 50 may be constructed of stainless steel, for example without limitation. In one non-limiting configuration, the head may have a generally cylindrical shape as shown. Other shaped heads however may be used.

InN could be grown at ~1000° C. for system pressures of 70 atm. Growth at these pressures could open the possibility of stable growth of high quality InGaN alloys across a larger alloy composition than currently accessible. Growth of InGaN at ~1300° C. for system pressures of ~100 atm would allow for growth above a miscibility window allowing for practical synthesis capability to the entire solid solution region for InGaN (i.e. from pure GaN to pure InN without having resort to other means of stabilizing the In in the InGaN film).

AlN typically likes to grow at elevated temperatures >1200° C. due to strong bonding of Al to N. As such, growth of AlInN is particularly constraint as a lack of adatom mobility significantly reduces the available compositions. Growth of AlInN is hence significantly improved at elevated temperatures and pressures as adatom mobility and reduced decomposition and desorption of In from the surface improves its incorporation. Growth of the full AlInN range would require pressures in excess of 100 atm yet below 300 atm. Substrate temperature should reach ~1000° C. (for InGaN alloys) with a target of up to 1400° C. (for high Al containing AlInGaN alloys).

Growth of GaN with other alloys elements such as bismuth, boron, rare-earth metals at elevated pressures leads to an enhanced incorporation of these additional elements. As such, not only can GaN be grown at higher temperatures to modify its growth behavior and incorporation mechanisms, but higher concentrations of additional elements be achieved which typically do not want to incorporation in large concentrations into the material. For certain systems, increasing the pressure from 1 to 100 atm leads to increases in concentration of an atomic species by ~10-100×.

It bear noting that present HPS-CVD process is expressly not limited to process pressures exceeding 1 atm. In other embodiments contemplated, atmospheric (i.e. 1 atm) and sub-atmospheric pressures (less than 1 atm) might be used instead.

With continuing reference to FIGS. 1-4, tool head 50 generally includes a top wall 57, circumferentially-extending annular bottom edge 54, and peripheral sidewall 55 extending between the top wall and bottom edge. The walls and edge may have any suitable configuration. The top wall 57 may form a continuous flat top surface as shown in FIG. 1, or alternatively the top surface may be interrupted by various radially extending and/or other oriented recesses as shown in other figures discussed further below. The head 50 defines a large downwardly open internal cavity 56 which is configured to receive the susceptor 22 and upper support patter 23-2 of pedestal 23 at least partially therein through the bottom opening 58 of the tool head 50 for performing the HPS-CVD process. When positioned inside the head, these elements and wafer 30 occupy a lower portion of the cavity 56 within the sealed pressure boundary of the head 50.

Internal cavity 56 of head 50 is divided into a plurality of internal gas source process chambers 51 by separating barriers 52. The bottom edges 59 of the barriers may be spaced vertically above and inwards from the bottom edge 58 of the head inside cavity 56. In one embodiment, the bottom edges 59 of the separating barriers all lie in a same horizontal plane for forming a uniform boundary layer 53 above the wafer 30 where the reactant gases from each chamber are mixed before incorporation into the growing crystal thin film. Chambers 51 are arranged in a circular array above the susceptor 22; each chamber occupying a zone or sector of the head cavity 56. The chambers 51 are downwardly open to the exposed top surface of the wafer 30 for incorporating and depositing the thin crystalline layer to be formed thereon. Any suitable number of process chambers may be provided depending on the number of reactive gas sources to be used in depositing the crystalline layer of desired chemical/elemental composition on the wafer (e.g. InGaN, AlInN, etc.). It bears noting that some chambers may be used for providing source to the wafer 30 which do not contain reactive species (e.g. metals or organic materials) but are necessary for the gases for the process to form the desired thin film (e.g. ammonia—$NH_3$).

Although fours chamber 51 are shown in the figures as a general example for ease of illustration, the HPS-CVD tool 20 may have approximately 6-10 chambers—one each for the type molecule (reactive specie or precursor) carried by the source gas to be incorporated into film and additional chambers as needed to supply other elements to the growing thin film crystal. In some embodiments, certain chambers may contain gas for doping the semiconductor such as Mg or Si doping to change electrical or optical properties for example. Any type dopant may be used with the present HPS-CVD tool and film deposition process.

Figure 6:
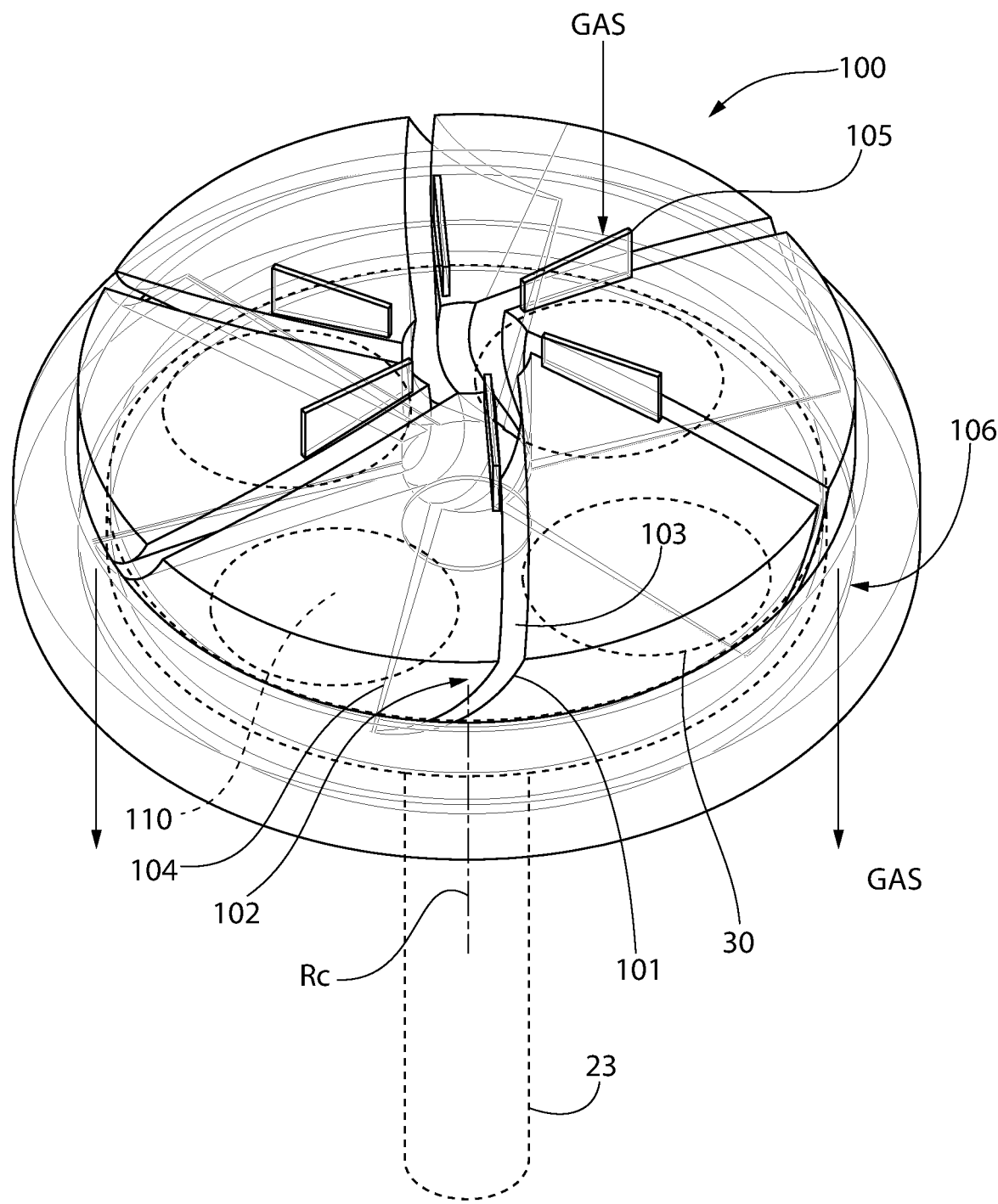
FIG. 6 is a perspective view of a second embodiment of a HPS-CVD reactor or tool.
Figure 7:
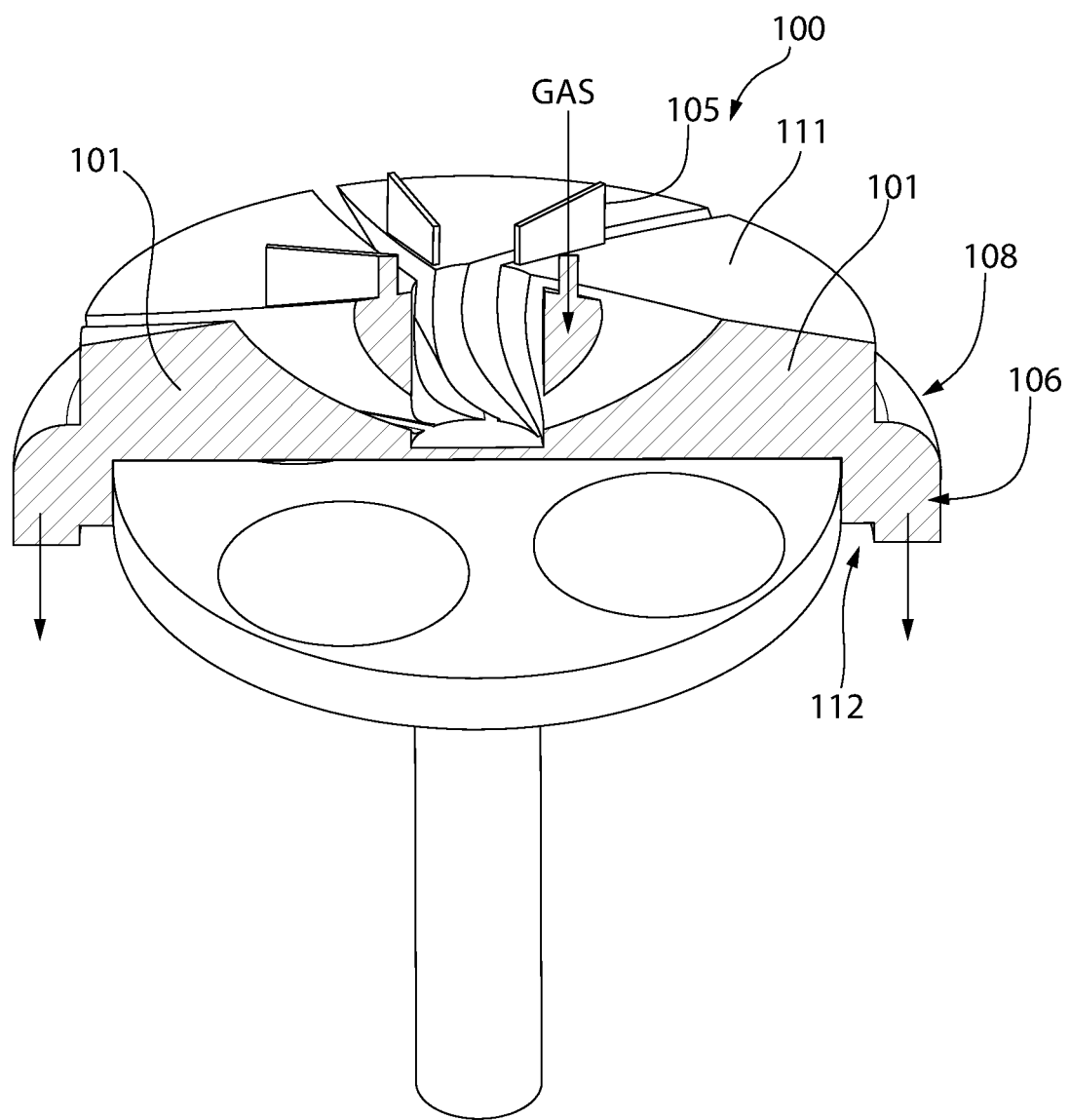
FIG. 7 is a perspective cross-sectional view thereof.
Figure 8:
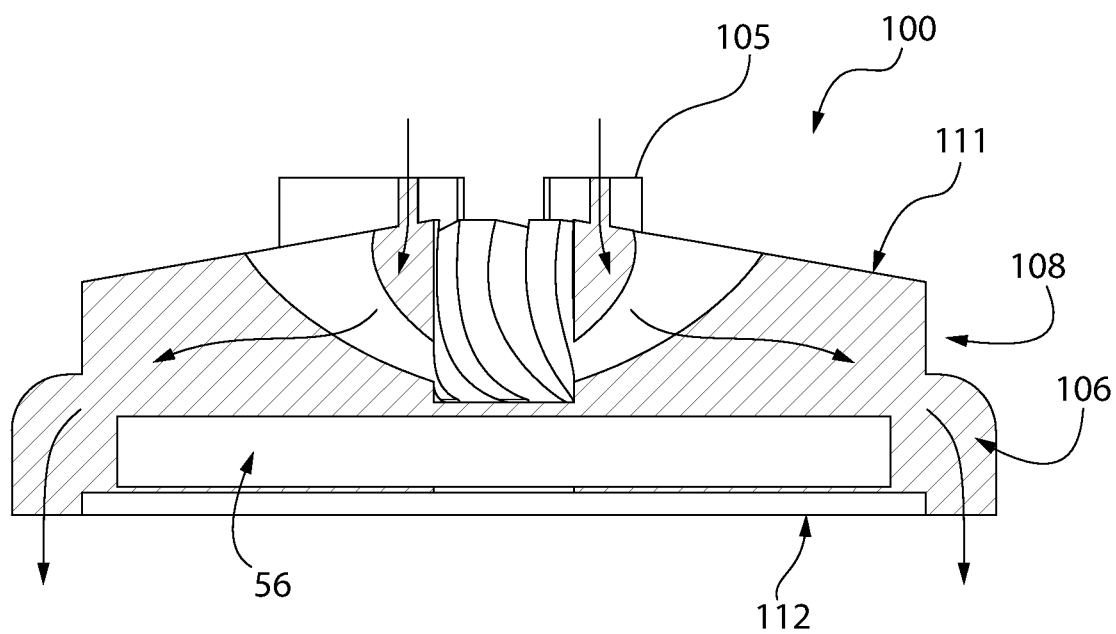
FIG. 8 is a side cross-sectional view thereof.
Figure 9:
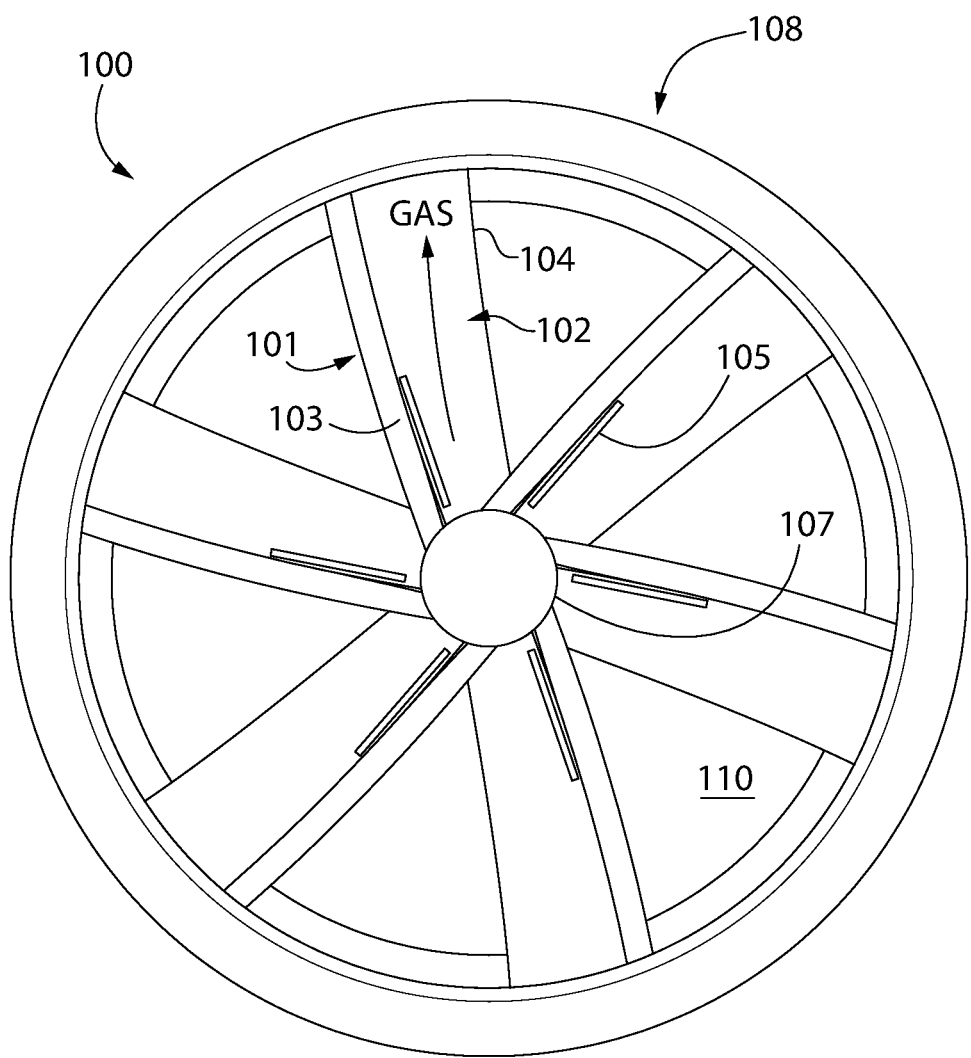
FIG. 9 is a top plan view thereof with top wall removed to reveal internal structures.
Figure 15:
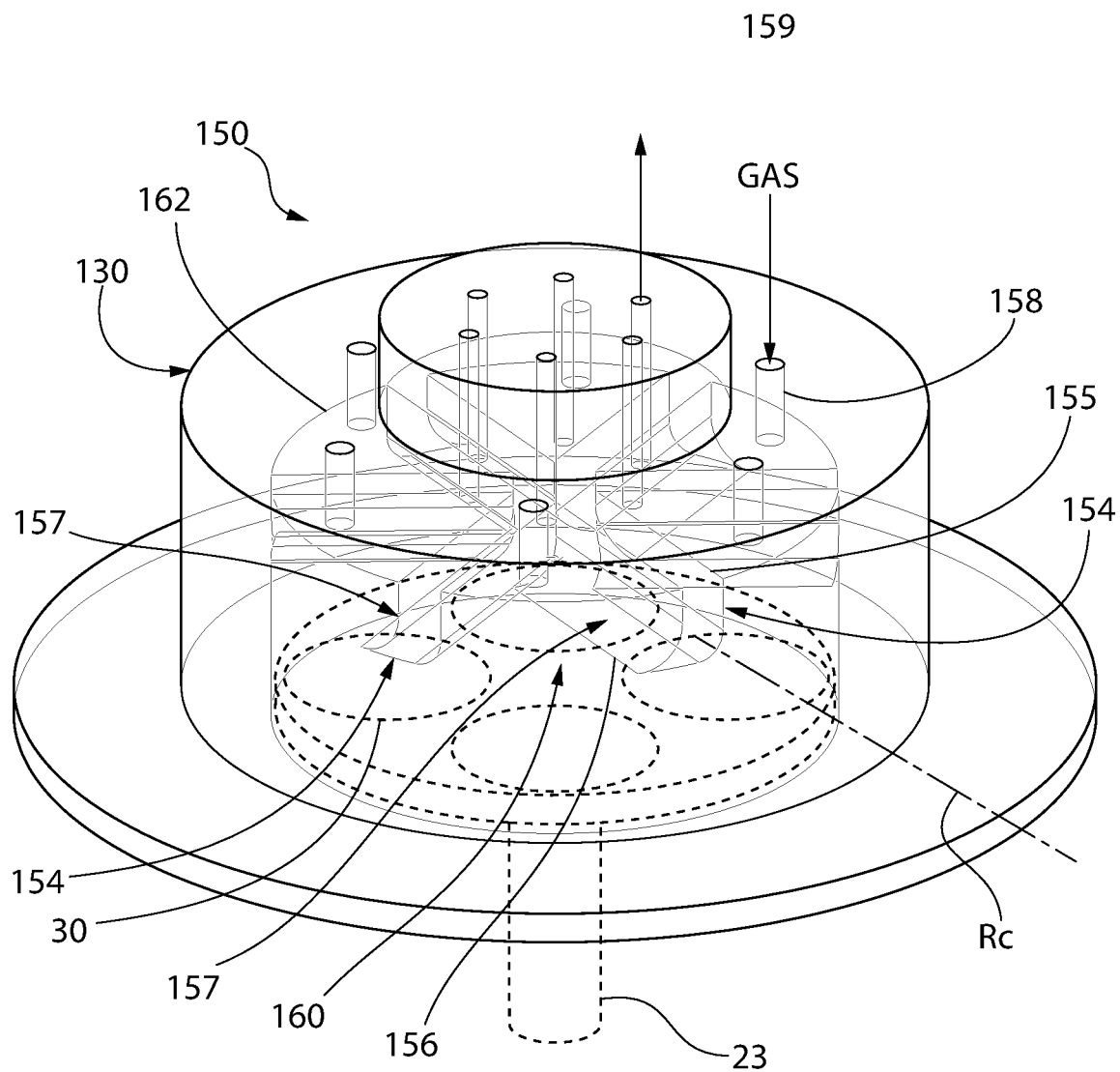
FIG. 15 is a perspective view of a second modular embodiment of a HPS-CVD reactor or tool showing an assembly comprising an outer pressure retention shell and inner process insert.
Figure 16:
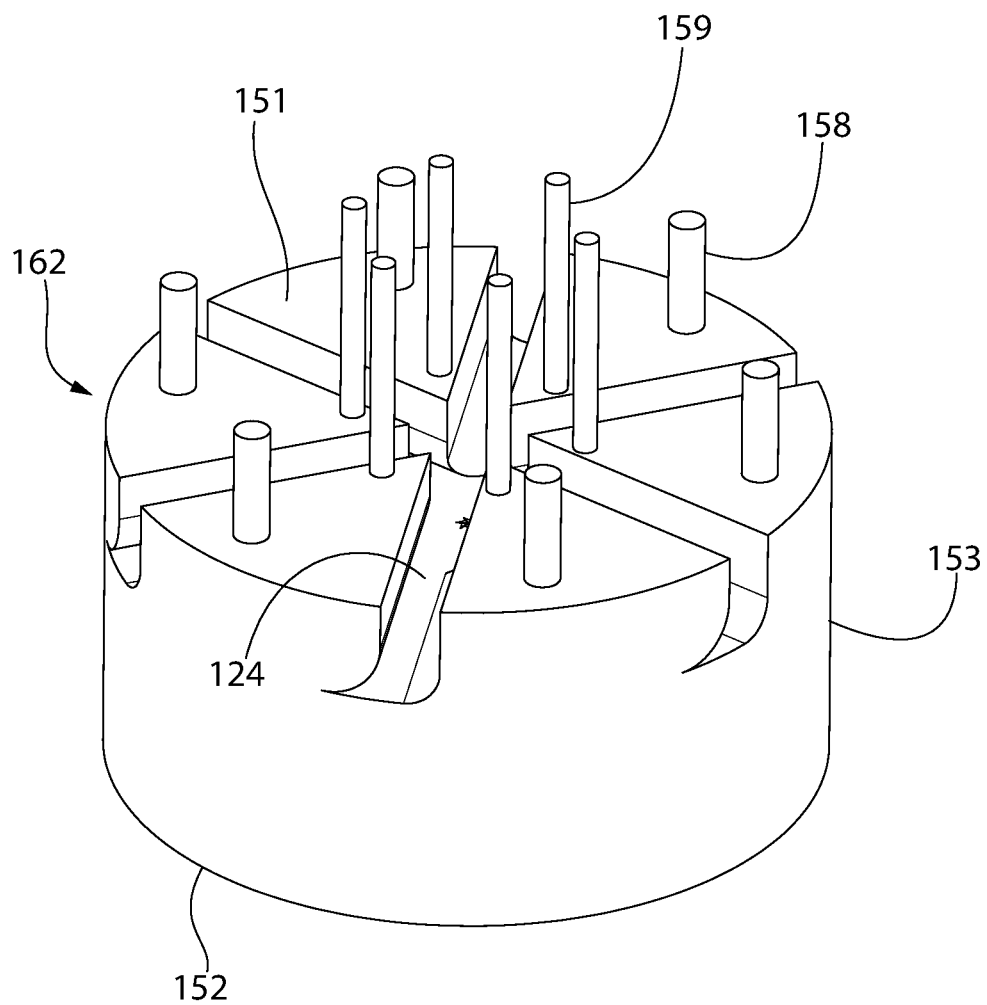
FIG. 16 is a perspective cross-sectional view of the process insert of FIG. 15.
Figure 17:
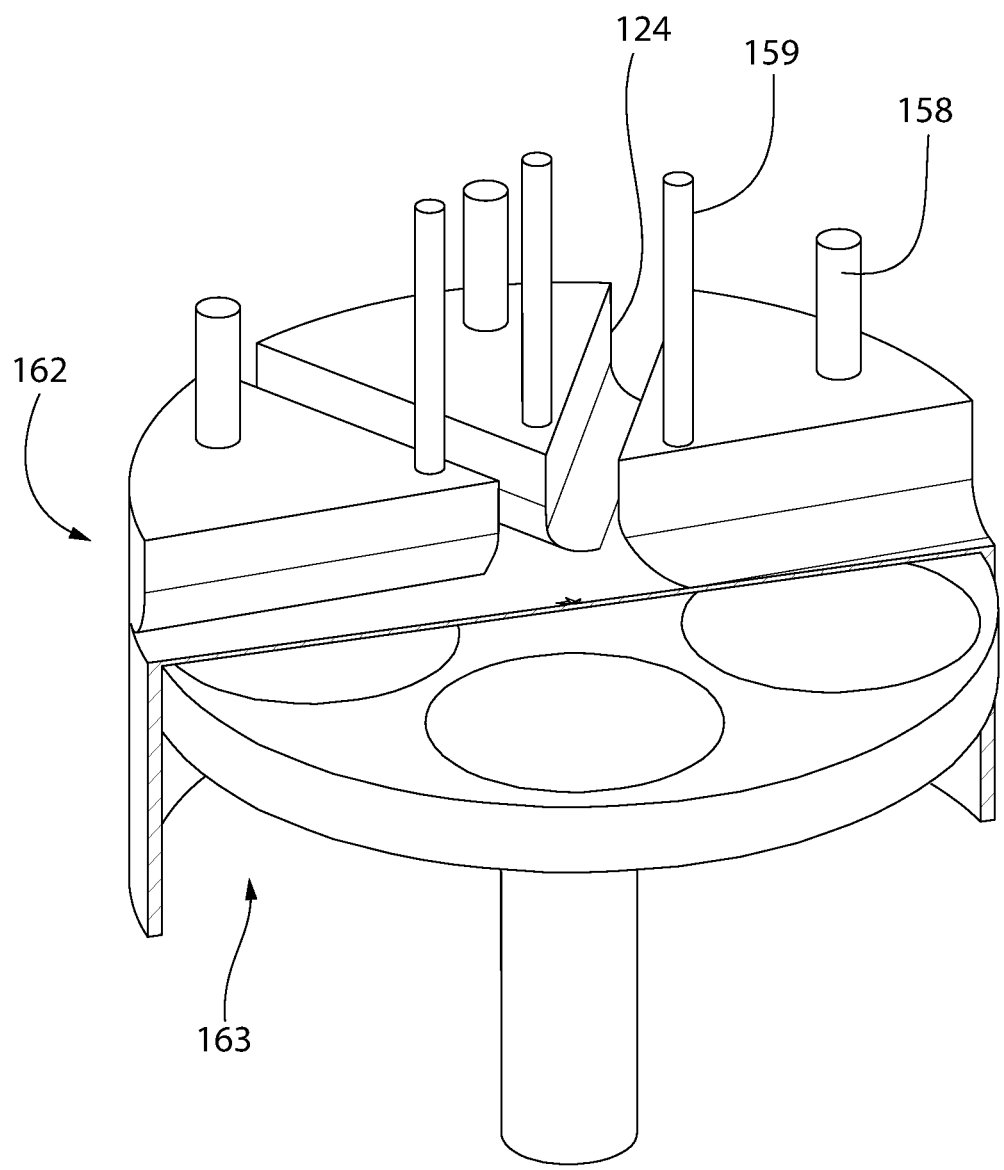
FIG. 17 is a perspective cross-sectional view thereof.
Figure 18:
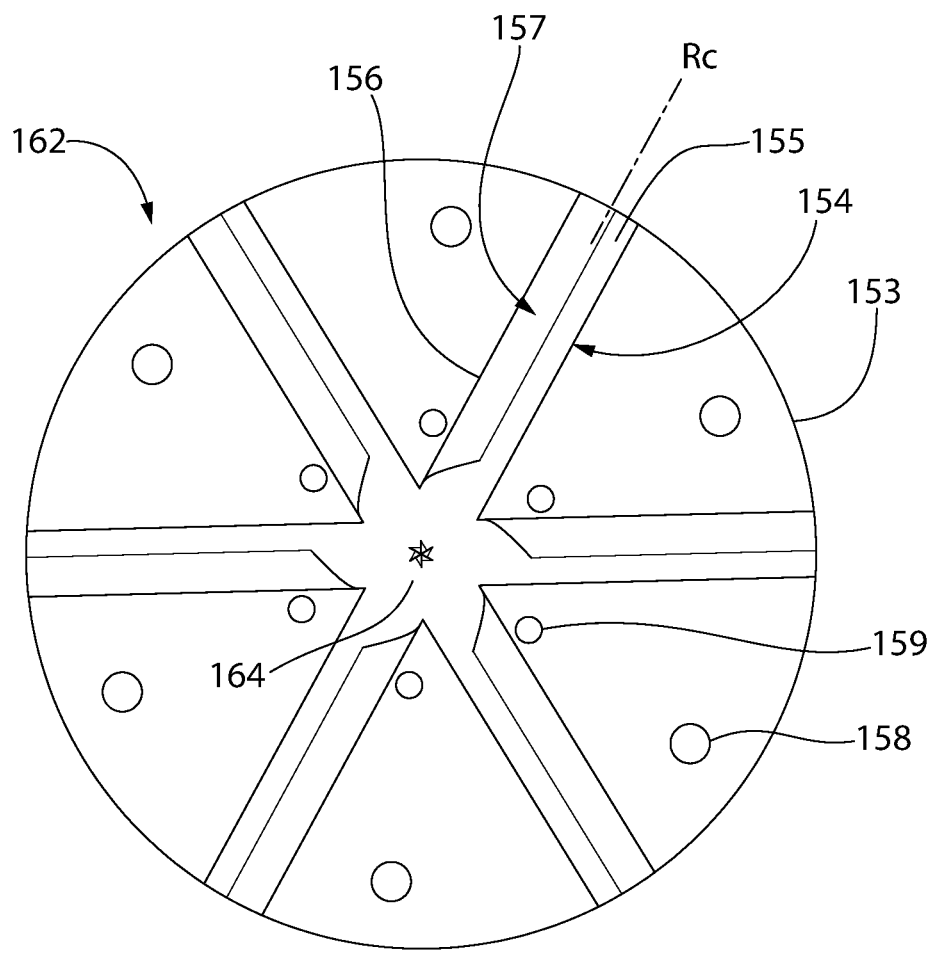
FIG. 18 is a top plan view thereof with top wall removed to reveal internal structures.

Each individual gas source process chamber 51 is fluidly isolated from every other chamber by the separating barriers 52 to prevent mixing of the individual gas sources (see, e.g. FIGS. 1-4) and their chemistries in tool head 50 before entering the boundary layer 53. The separating barriers are substantially vertically oriented with some out-of-plane deviation in shape dependent on the exact configuration of the barrier surfaces (see, e.g. FIGS. 6, 15, and 19). Barriers 52 preferably extend radially inwards between the sidewall 55 of tool head 50 and the central hub portion 50-1 of the head 50 closest to the axis of rotation Ra of the HPS-CVD tool 20. The barriers 52 converge and meet at the hub portion to complete the fluid isolation (best shown in FIG. 3).

The gas source process chambers 51 may have any suitable configuration. The process chambers 51 may have the same configuration and volume, or alternatively the configurations and/or volumes may be different. The shape of the wall surfaces 56 of the barriers 52 and their orientation and arrangement inside the head 50 concomitantly defines the configuration of the chambers 51. The barriers 52 and associated the chambers 51 may be designed to achieve certain gas flow dynamics and patterns through the chambers to control factors such as undesirable gas flow turbulence and formation of vortices, which may adversely impact forming a uniform boundary layer 53 formed between the bottom edges 59 of the barriers 52 and top surface 30-1 of wafer 30. This in turn adversely affects forming conformal thin films on the wafer 30 of uniform thickness.

Figure 4:
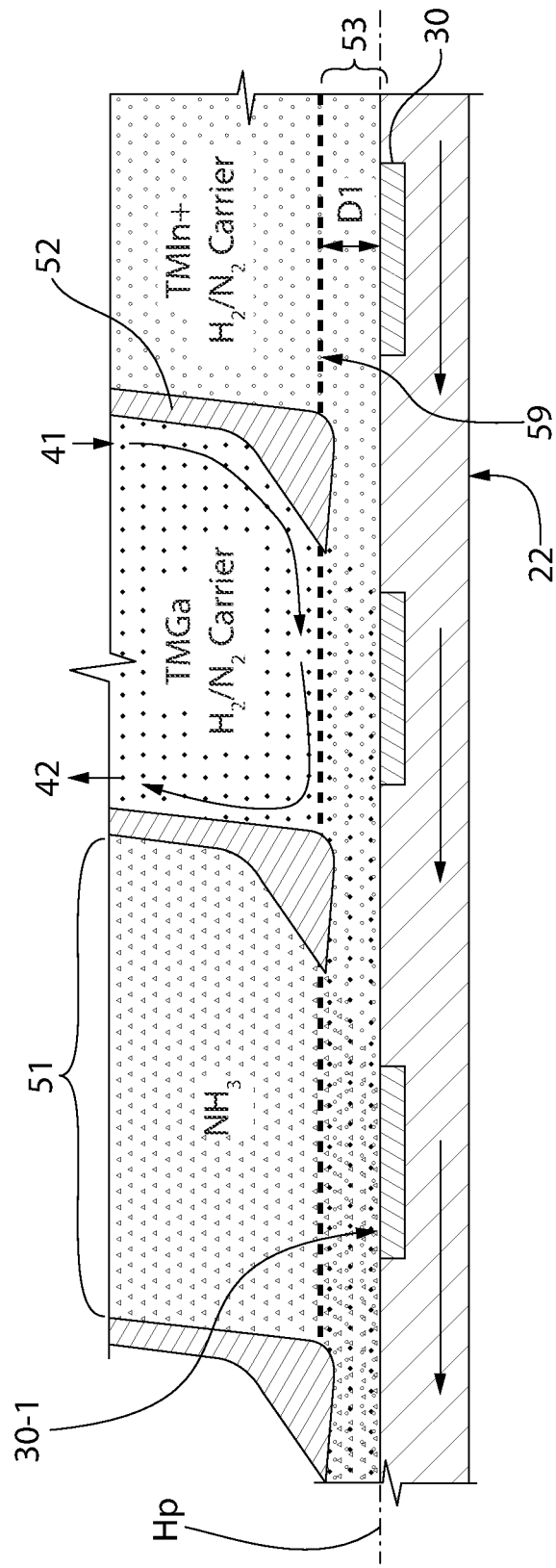
FIG. 4 is a schematic diagram showing a linear representation of the circular CVD process flow path of several substrates in the form of wafers through the HPS-CVD tool of FIG. 1.

Referring to FIG. 4, the bottom surfaces or edges 59 of the separating barriers 52 within the pressure retaining head 50 are spaced apart from and slightly elevated above the top surface of the susceptor 22 supporting the wafer 30 by an settable vertical clearance or separation distance D1. D1 may be for example without limitation may be in the range of and including 0.1 mm to 20 mm. In some embodiments, the distance D1 may be dynamically changed during a single process run or between runs to meet the requirement of the particular type film being grown. Rotating the susceptor at relatively slow to moderate speeds form a gaseous boundary layer 53 (see, e.g. FIG. 5) above and adjoining the susceptor (and wafer supported thereon). D1 limits and controls the thickness of the relatively thin boundary layer 53 in which the reactive gases from each chamber 51 first mix and react with the substrate to gradually grow crystalline layer with each consecutive revolution of the wafer on the susceptor. The susceptor carries the wafer in a circular path beneath each chamber 51 in tool 20. Each source gas in one chamber 51 may partially mix in the boundary layer with the source gas carrying over from the adjacent preceding chamber as the wafer rotates beneath each chamber in the head 50 (see, e.g. FIG. 4). This gas "carry over" effect is desirable with the present HPS-CVD system because the individual source gases generally need to be mixed in the boundary layer 53 so there is a carry over of gas species from one chamber to the next before they fully mix and form the film in order to incorporate all molecules in the growing thin film on the wafer. The boundary layer 53 in one embodiment is in fluid communication with and exposed to all of the gas process chambers 51 simultaneously in each zone or sector of the tool head 50 as the wafer continuously rotates.

According to one unique aspect of the present invention alluded to previously, the thickness of the boundary layer 53 formed above the wafer 30 (substrate) where the precursor reactions occur to build the epitaxial layer on the substrate is controlled by mechanical and physical means in lieu of control of process parameters. As with most CVD processes, the concentration and diffusion of the precursor species through the applicable boundary layer partially determines the stoichiometric ratio within the growing crystal. Laminar flow is desired to obtain high quality growth as growth proceeds in a controlled fashion. Control over the boundary layer profiles (velocity, thermal, concentration) is paramount towards achieving desired results. The proposed HPS-CVD separates the fluid flow velocities and rotational speed, as is commonly performed in most, if not all, commercially available horizontal, vertical, barrel or shower-head style CVD designs, from the established boundary layer thickness. Boundary layer thickness is independently controlled by vertical clearance or separation distance D1 between the bottom edge 59 of the separating barriers 52 and top surface 30-1 of wafer 30 on susceptor 22 (see, e.g. FIG. 4). The specific design of this interface is important to ensure a smooth, laminar boundary layer as the wafer transitions between the chambers. Given the design of the gas source process chambers, this separation distance D1 can be easily modified between growth runs, and may even be dynamically varied throughout the crystal formation run to provide run-time optimization of the fluid flow and changes to varying gas compositions and pressures throughout crystal growth. A suitable mechanical, electric motor-driven, or pneumatic/hydraulic adjustment mechanism 250 (shown schematically in FIG. 1) may be operably coupled to the pedestal rotor 27 to raise or lower the pedestal 23 relative to the head 50 and process chambers 51, thereby allowing distance D1 be varied as needed between wafer runs or during a single process run. In other embodiments, the adjustment mechanism 250 may be operably coupled to raise or lower the lower housing 26 Typical boundary layer thicknesses (i.e. D1) may be for example without limitation between 0.1-20 mm, yet this design is only limited in its thickness of boundary layer 53 by the vibrational stability of the pedestal 23 as it rotates carrying the wafer 30 on the susceptor. The HPS-CVD tool 20 may include ceramic ball or thrust bearings to ensure a controlled gap and smooth operation with minimal horizontal out-of-plane wobble. The boundary layer separation distance D1 may be controllable to within 0.1 mm with these mechanical systems at low rotational speeds of <1000 rpm of the pedestal/wafer.

The thinner the boundary layer, the faster the gases diffuse to the substrate and incorporate, thereby significantly reducing pre-reaction occurrences. It is further critical to note that mixing is almost exclusively achieved in the boundary layer as the transition between gas chambers forces all gas to be contained within a controlled fluid thickness—the boundary layer. Given the variability in pressure of the inlet gases, rapid and convenient control of the separating barrier design is one important criteria to rapidly advance and optimize growth conditions.

Figure 2:
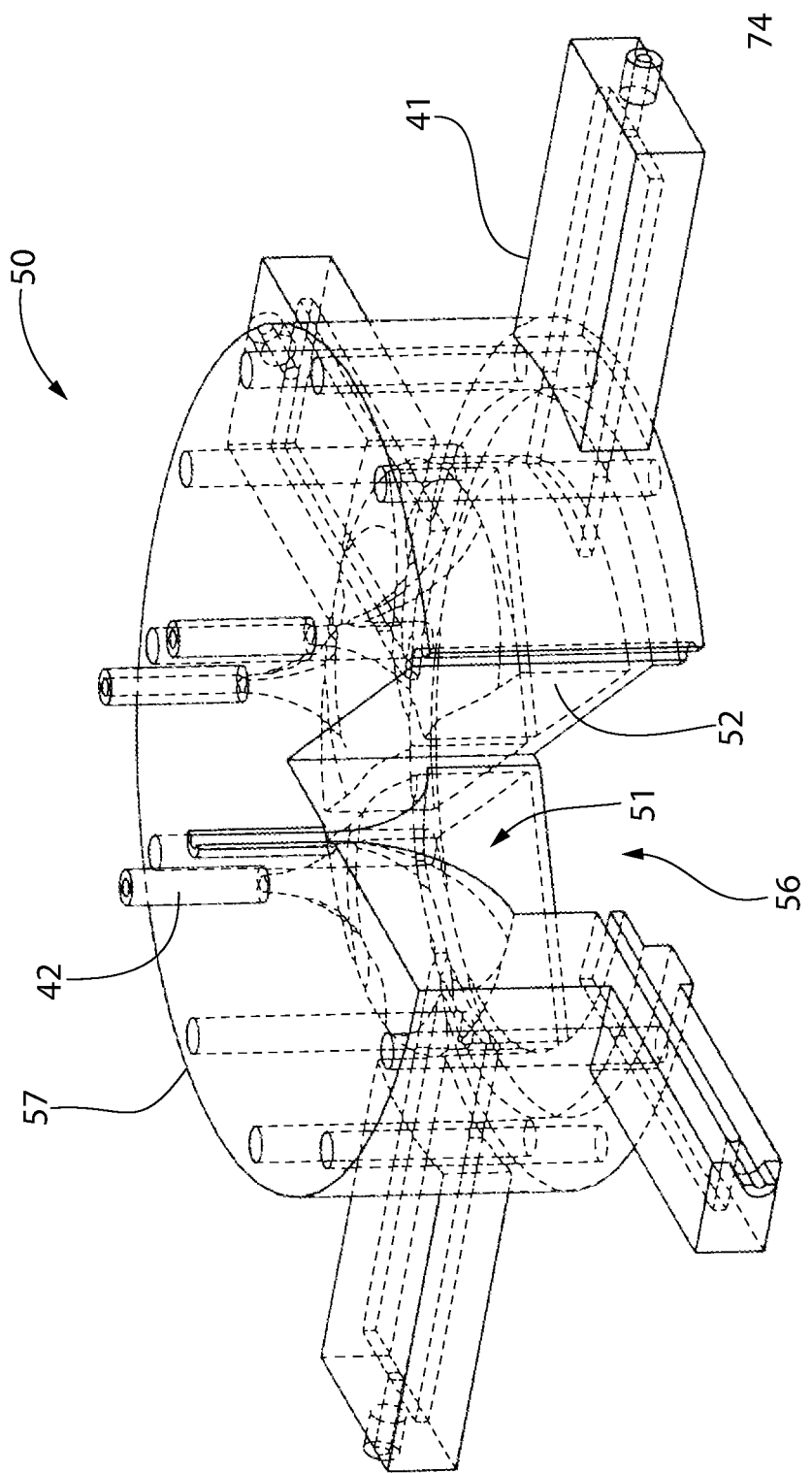
FIG. 2 is perspective view thereof showing only the pressure retention head of the tool of FIG. 1 in phantom lines.
Figure 3:
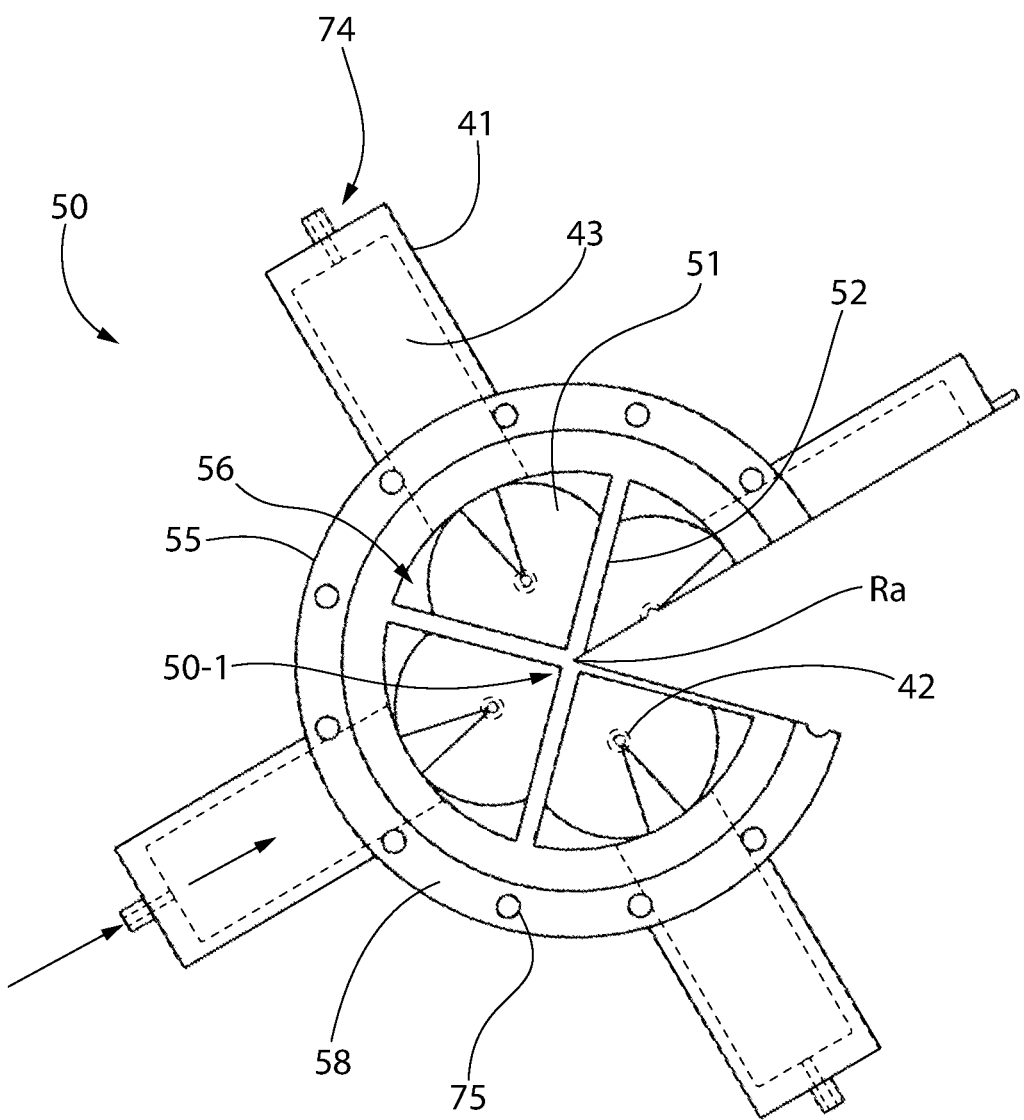
FIG. 3 is a bottom plan view thereof.

Referring to FIGS. 1-3, each gas source process chamber 51 includes a dedicated and discrete source gas inlet and outlet member 41 and 42 respectively. The inlet and outlet members are preferably fluidly isolated from every other inlet/outlet of other source gases on and within the head 50 to prevent pre-mixing and pre-reaction of the source gases upstream of the head 50 and individual gas source process chambers 51. The individual reactive gases and their unique chemistries preferably are only be subsequently exposed to each other and mixed in the boundary layer 53 in a preferred embodiment. The gas inlets and outlets 41, 42 may be elongated duct-like structures or elements having bodies which protrude outwards from and are affixed to the tool head 50. The inlets and outlets each comprise an internal flow channel 43 for fluidly coupling the reactant sources gases with the chambers 51. Flow channels 43 may have any suitable cross-sectional shape or combinations thereof including for example without limitation polygonal (e.g. rectangular, square, hexagonal, etc.), non-polygonal (e.g. circular, etc.). As an example, FIG. 3 shows gas inlets 43 having a rectangular cross-sectional shape. Flow channels 43 open at an innermost end internally into their respective chambers 51 for injecting the reactive process gas (gas inlets), or extracting the gas from the chamber (gas outlets). The free terminal ends of the gas inlets and outlets 41, 42 are configured for fluid coupling to flow conduits 62 of the gas supply system 60 via flow fittings 74 (see, e.g. FIGS. 3 and 5).

Externally, the inlet and outlets 41, 42 may have any suitably shaped elongated body including polygonal including rectilinear cuboid forms, hexagonal, etc., non-polygonal including cylindrical, or combinations thereof. The gas inlets and outlets are designed and oriented to introduce the process gases into each chamber in a manner which preferably minimizes gas flow turbulence within each chamber 51 by minimizing or eliminating undesirable flow vortices and to control gas velocities all of which contributed to uniform deposition of the thin film on the wafer 30. Accordingly, the gas inlets and outlets 41, 42 may linearly straight, angled, curved, or combinations thereof in configuration. In one embodiment, the gas inlets 41 may be radially oriented perpendicularly to the axis of rotation Ra to introduce each source gas in a generally radially inwards direction (perpendicular to rotational axis Ra of tool 20) into its respective process chamber 51 through the exterior sidewall 55 of head 50 (see, e.g. FIG. 1). Alternatively, the reactive source gases may be introduced through the top wall 57 of the head 50 in the process chambers 51 parallel to rotational axis Ra of tool 20. In other embodiments, the gas inlets 42 may be oriented to introduce gas tangentially into each process chamber 51.

The gas outlets 42 may be vertically oriented parallel or obliquely angled to the axis of rotation Ra. In some embodiments, gas outlets 42 may be fluidly coupled to the top of each chamber 51 through top wall 57 of the head, or through sidewall 53 of the head 50 from each chamber. Other locations and orientations of the gas inlets and outlets is possible.

In the illustrated non-limiting embodiment of FIGS. 1-3, source gases from the pressurized gas sources 40 each enter the outer peripheral portion of its respective dedicated gas process chamber 51 in a radially inwards direction via the gas inlets 41, and exits each chamber in a vertical upwards direction via the gas outlets 42 near the inner portion of each chamber at the central hub portion 50-1 of the head 50 closest to the axis of rotation Ra of the HPS-CVD tool 20. The gas flowpath through the chambers is generally right angled in these figures. Other arrangements of the gas inlet and outlet elements and flowpath configurations through the chambers 51 may be used in other embodiments.

Referring to FIGS. 1-3, the tool head 50 may be detachably coupled to the lower housing 26 of HPS-CVD tool 20. In one embodiment, a bolted connection may be provided using a plurality of threaded fasteners 72 which extend through a diametrically enlarged mounting flange 73 of the lower housing 26 and threadably engage mating threaded holes 75 in the bottom of the tool head 50 (e.g. lower sidewall 55 as shown in FIG. 3). A high pressure hermetic seal may be created using a suitable gasket 70 (represented by dashed lines) at the openable/closeable annular interface between the head 50 and lower housing 26 to form the sealed process environment inside the head cavity 56. The axial length of the pedestal 23 may be chosen, such that the resulting temperature drop will permit use of standard polymer based rotating seals with the possibility of external lubrication. The ring-shaped pressure retaining, external electric leads 25 on pedestal rotor 27 may be made via graphite rings separated by polymer based ring insulators 24. Rotation of pedestal 23 (with susceptor 22 and wafer 30 thereon) may be achieved by using a variable speed, computer controlled motor 28 coupled to the bottom low-pressure end of the pedestal rotor 27.

Figure 5:
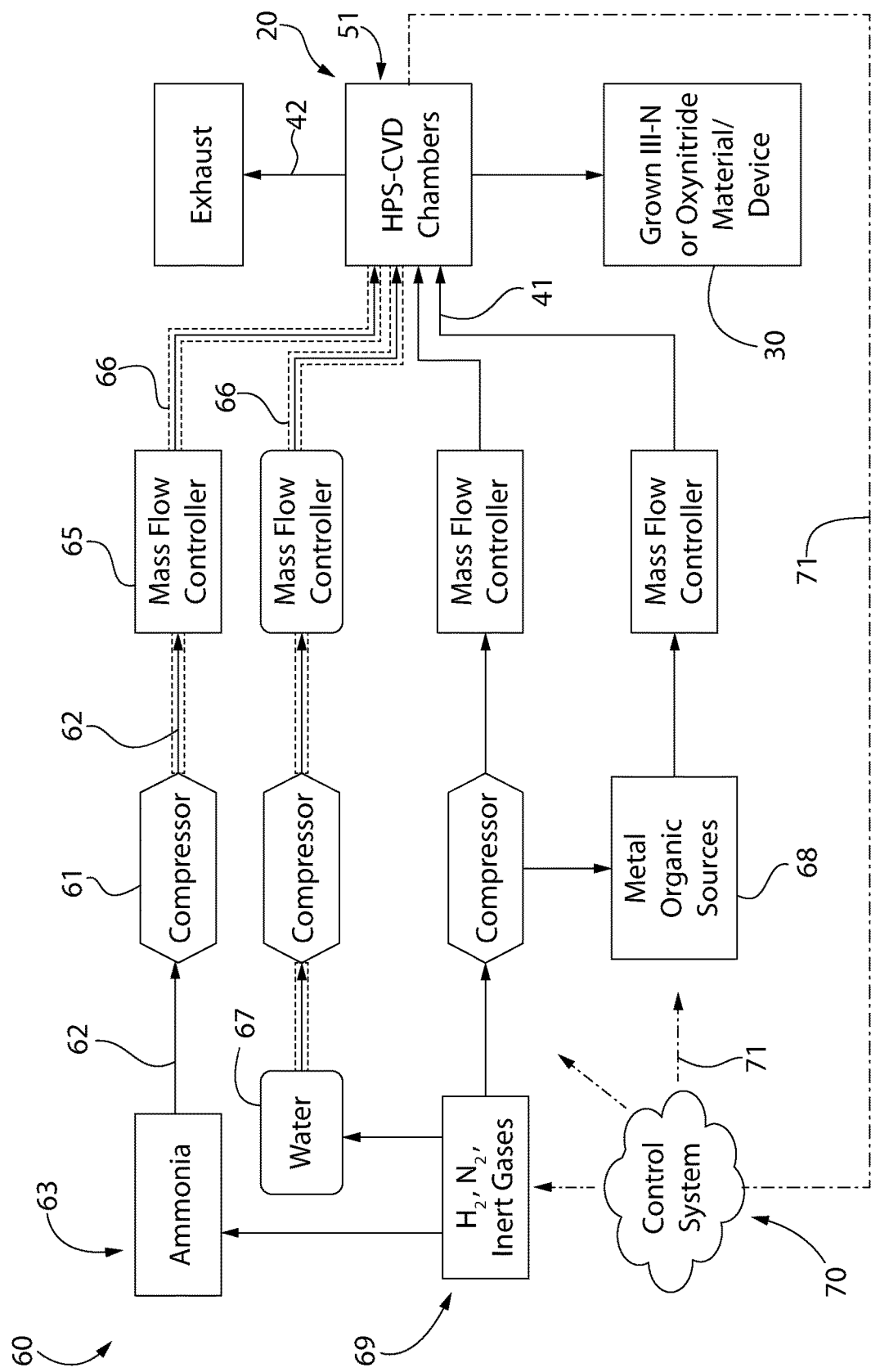
FIG. 5 is a schematic block diagram of a gas supply system associated with the tool of FIG. 1 for providing reactant source gases containing one or more volatile reactant species to be deposited and incorporated in the thin film on the substrates.

FIG. 5 is a simple schematic block diagram showing one non-limiting exemplary embodiment of gas supply system 60 associated with and fluidly coupled to the HPS-CVD tool 20. The pressured gas sources 40 for each process chamber 51 of the HPS-CVD tool head 50 may comprise a plurality of individual source gas supply canisters or tanks 63, 69, each initially filled and pressurized to a pressure higher than the desired high pressure system operating pressures (e.g. >1 atm) and paired with a respective pressure regulator 64 to control and achieve the system operating pressure. In other embodiments requiring higher system pressures than can be provided by the supply tanks alone, compressors 61 may additionally be provided in combination with the gas supply tanks 63, 69 for any of the supply tanks as needed to elevate tank pressure sufficiently to achieve the desired system operating pressures for increasingly higher system operation pressures as needed.

To grow unconventional III-N thin films on substrate 30, the gas supply system 60 includes ammonia ($NH_3$) tank 63 in addition to inert gas tank 69. To grow oxynitride films, water source 67 (e.g. tank) may additionally be furnished. Each fluid flow stream in system 60 is regulated and controlled by a dedicated mass flow controller 65 to ensure that the desired flow rates of each fluid is provided to its respective process chamber 51 in the tool head 50 for proper growth and composition of the desired film.

Although some components in FIG. 5 are shown as being combined for brevity and ease of illustration only, it is important to note that each respective set of tanks, regulators, and flow conduits 62 shown in the individual gas supply trains are in actuality fluidly isolated from every other set to prevent premixing and pre-reactions of precursors upstream of the individual tool head process chambers 51, as previously described herein. Additionally, associated flow restrictors, valves, gas management devise, etc. are not indicated though are included as needed to manage the fluid flow from the individual sources into the growth chamber and associated exhaust streams.

To prevent condensation formation of vapors in some process flow conduits 62, the appropriate supply lines susceptible to condensation may be heated by use of auxiliary line heaters 66 applied to the exposed external portions of the affected flow conduits.

Operation of the HPS-CVD tool 20 and gas supply system 60 may be automatically controlled by a control system comprising a programmable controller 70 to control some or all aspects of the wafer film deposition process. Accordingly, controller 70 shown in FIG. 5 may be operably and communicably coupled to each operable gas supply system component and the HPS-CVD tool 20 via communication links 71 to control its operation (e.g. pedestal motor 28 actuation and speed, susceptor 22 heating and temperature, etc.).

The programmable controller 70 includes a programmable processor which may be one or more processors or microprocessors, a system on a chip (integrated circuit), one or more microcontrollers, ASICs (application specific integrated circuits), or combinations thereof. Probe controller 70 includes processing logic for executing programmable control logic or software instructions comprising one or more programs which are executed by the controller to control operation of the sampling system, mass flow controllers, valves, temperature regulating systems, pressure of the system, etc.

Probe controller 70 may further include an input/output communication interface or module configured for wireless and/or wired communication for programming the processor, sending and/or receiving control and data signals from the tool 20 and components of the gas supply system 60, etc. The communication module therefore may be configured for transmitting and receiving communications and data via wireless and/or wired protocols to and from the tool and flow-related components to control their operation.

Probe controller 70 further includes non-transitory tangible computer readable medium operably coupled and accessible to the controller. The computer or machine accessible and readable medium may include any suitable volatile memory and non-volatile memory or devices operably and communicably coupled to the controller processor(s). Any combination and types of volatile or non-volatile memory may be used including as examples, without limitation, random access memory (RAM) and various types thereof (e.g. ferroelectric RAM, DRAM, etc.), read-only memory (ROM) and various types thereof, hard disk drives (HDD), solid-state drives (SSD), flash memory, SD card, USB drive, or other suitable memory and devices which may be written to and/or read by the processor operably connected to the medium. The non-volatile memory may thus be any permanent or removable type memory. Both the volatile memory and the non-volatile memory are used for storing programming logic (program instructions or software) executed by the controller processors to direct operation of the controller, and storing operating and processor parameters with operation of the HPS-CVD tool 20 and process including real-time measurement of system operating data such as temperatures, pressures, rotational speed (rpm) of the pedestal/wafer, etc. which may be collected by a plurality of sensors includes with the system. Both the volatile memory and the non-volatile memory may be used for storing the program instructions or software.

A method or process for forming a thin film on a substrate such as without limitation a wafer will now be briefly summarized. The system controller 70 may control some or all of the aspects of the thin film deposition process described below. The HPS-CVD reactor or tool 20 of FIGS. 1-4 (or alternatively any of the other embodiments disclosed herein) is initially provided and readied for processing. At least one or more wafers 30 may be placed on the susceptor 22 in a preferably off-center arrangement such that the rotational axis of the tool 20 which coincides with its vertical centerline does not intersect any of the wafers. This allows thin films to be deposited on multiple wafers in series for production efficiency.

In operation, motor 28 is started to rotate the pedestal 23, which rotates the susceptor 22 therewith about the rotational axis Ra of tool 20. The wafer 30, supported off-center from axis Ra on the susceptor, is translated in a circular path by the rotating pedestal and susceptor. The wafer does not rotate itself relative to the susceptor in this embodiment, though can be implemented to improve the quality or uniformity of the growing thin film material. The wafer 30 is continuously translated in the circular path during the process passing multiple times beneath each of the process chambers 51 in the tool head 50 in succession from start to finish of the film formation process. Each chamber 51 preferably has a radial and circumferential extent and size (e.g. surface area) projected in a horizontal reference plane Hp larger than the diameter of each wafer to expose the entirety of the top surface 30-1 of the wafers to each chamber for ensuring uniformity in the film deposition (reference FIG. 4). Accordingly, the horizontal footprint of each chamber 51 in the reference plane Hp is larger than the wafer.

The gas supply system 60 shown in FIG. 5 is started. This feeds the reactant process gases to their respective process chambers 51; each gas having a unique gas chemical or composition that includes a different volatile precursor containing the molecules necessary to deposit the desired species on the wafer. The gas flow streams are fluidly isolated from each other as previously described herein. Each process gas flows continuously into and through its respective process chamber 51 in the tool head 50 via gas inlets 41, and is exhausted from the chamber via the gas outlets 42. Accordingly, the process chambers are continuously replenished with a fresh gas supply.

As the wafer travels along its circular path on the susceptor, it passes successively/consecutively under each process chamber 51 in turn and is exposed to the unique gas chemistry therein. The boundary layer 53 forms above the top surface of the wafer 30 as the wafer rotates on pedestal 22. The gases diffuse into or mix with the boundary layer immediately below each chamber where they mix and react for the first time with the other gases from the other chambers. There is an amount of "carry over" of each gas species from one chamber to the next successive chamber or chambers before the gases fully mix and form the film to incorporate all molecules in the growing crystal layer on the wafer (see, e.g. FIG. 4 showing carry over of the reactant gases from the chambers to the right). FIG. 4 shows the actual circular rotation path of the wafer on the susceptor 22 and pedestal 23 rearranged in a linear format instead for ease of illustration and description. By consecutively exposing the wafer to two or more process chambers containing gases with one or more volatile reactive species, a thin film is gradually grown in thickness with each successive pass and exposure of the wafer to the unique volatile reactive species (one or more) from the individual chambers. The reactive species are different in each chamber from every other process chamber which are fluidly isolated from each other to prevent pre-mixing and pre-reactions in the tool 20 other than in the boundary layer where intended for optimum thin film formation. Upstream of the tool, the source gases which supply the reactive species to each chamber are fluidly isolated from each other to prevent pre-mixing and pre-reactions as previously described herein.

As the wafer continues to be rotated beneath and "sees" each the gas in each process chamber 51, the thin film is gradually deposited and grows in thickness with each successive pass and exposure of the substrate to the circular array of process chambers. The heat applies to the wafer via the susceptor 22, rotational speed of the pedestal 23 (and wafer thereon), gas mass flow rate, gas pressures, and other operating parameters may all be controlled by the system controller 70 as previously described herein to ensure formation of a uniform thickness film on the wafer. Once the desired film thickness has been formed on the wafer(s), the process is stopped allowing the wafers to be removed for further processing in the semiconductor foundry to complete fabrication of the chips/dies.

It bears noting that present HPS-CVD process is not a typical or conventional sequential process in which reactive gases/molecules are introduced into each chamber and completely reacted with the wafer substrate before moving the wafer to next gas source process chamber. Accordingly, multiple revolutions of wafer through/past each process chamber gradually build the desired thin film with each rotation to the required final thickness. The reactive gases/molecules are thus partially reacted in each chamber before the wafer rotates to the next succeeding process chamber. The partially reacted gas carries over to the succeeding process chamber which advantageously enhances the chemical reactions and incorporation of the precursors into the thin film. The rotational speed of the wafer is important and pre-selected to ensure the gases have not fully reacted with the wafer in each process chamber until the next chamber comes into view to maintain still mostly gaseous phases in the boundary/mixing zone or layer (boundary layer) when the next chamber is encountered. Accordingly, the rotational speed (rpm) has a minimum value for each film deposition process conducted which ensures the gases have not fully reacted with the wafer in each chamber based on the composition of the film to be grown and its unique gas chemistries involved.

The different reactive gases/molecules introduced to the wafer in each chamber are gradually mixed within the thin boundary layer while preferably maintaining laminar flow of gases over the top of the wafer by controlling the rotational speed of the pedestal, inlet gas flow, and the geometry of the chamber, which in turn controls the rotational speed of the susceptor and wafer supported thereon. Laminar gas flow conditions are essential for a uniform coating and thickness of crystalline film on the wafer substrate. Gases generally need to be mixed in the boundary layer so there is a carry over of gas species from one chamber to the next before they fully mix and form the film to incorporate all molecules in the growing crystal layer on the wafer.

Example (1)

Use of the HPS-CVD to grow high indium-content quaternary group-III-Nitride materials. In this embodiment, the HPS-CVD would be split into six different chambers containing the following volatile reactive gas or gas mixtures (TMGa=Trimethylgallium, TMAl=Trimethylaluminum, TMIn=Trimethylindium, Trimethyl=$(CH_3)_3$, $Cp_2Mg$=bis-(cyclopentadienyl) magnesium, $N_2$, $H_2$, $NH_3$, $Si_2H_6$) and non-reactive gas (Inert Gas):

Nitrogen source: $NH_3+N_2+H_2$+Inert Gas
Group-III element: TMGa+$N_2+H_2$+Inert Gas
Group-III element: TMAl+$N_2+H_2$+Inert Gas
Group-III element: TMIn+$N_2+H_2$+Inert Gas
P-type dopant: $Cp_2Mg+N_2+H_2$+Inert Gas
N-type dopant: $Si_2H_6+N_2+H_2$+Inert Gas Each reactant gas zone (e.g. process chamber 51) contains a primary molecule containing the desired element which will be incorporated into the growing crystal. Changing the relative concentration of the various gas molecules changes the composition of the growing crystal, i.e. by increasing the relative concentration of TMIn with respect to the other gases present in the chamber ($N_2+H_2$+Inert Gas) will lead to an increase in indium content of the growing Group-III nitride AlInGaN.

By increasing the total operating pressure of the HPS-CVD system, an increase or modification of the alloy composition and dopant concentration in the growing AlInGaN can be achieved.

By increasing the total system pressure of the system, the growth temperature can be increased, thereby leading to improved growth quality and/or enhanced growth rates, all while maintaining the same alloy composition. In the most extreme case, growth of InN can be achieved at common growth temperatures of GaN at 1 atm pressure (~1000° C.) if the total system pressure is raised to approximately 70 atm. InN commonly decomposes at temperatures in excess of 500° C. under 1 atm conditions.

Modifications to the above example can be prepared by adding a boron source to growth BAlInGaN. A boron source could be diborane ($B_2H_6$). Growth of oxy-nitride materials, such as InGaON can be achieved by adding a chamber containing $O_2$ or $H_2O$.

Numerous variations of the HPS-CVD reactor or tool 20 and its appurtenances, particularly the separating barriers between process chambers 51 and gas inlet/outlet configuration and arrangement, are possible. This allows these features to be customized for optimizing gas flow into, through, and out of the process chambers to enhance the performance of the HPS-CVD and quality of thin film produced in a manner which can accommodate the unique gas chemistries involved to grow films of different types/compositions. Following are a few non-limiting examples of such alternative tool designs and arrangements. Features of these alternative designs are the same as tool 20 unless specifically noted otherwise.

FIGS. 6-9 show a first alternative embodiment of HPS-CVD reactor or tool 100. Similarly to tool 20, present tool 100 has a generally cylindrical body including top wall 111, bottom wall 112, and vertical sidewall 108. In this embodiment, the separating barriers 101 are shaped as curved impeller blades which include arcuately curved surfaces 102 extending between the top and bottom radial edges 103, 104 of each barrier to introduce the inlet gas flow more smoothly into the process chambers 51 via gas inlets 105. The gas is introduced in a downward vertical direction into the innermost portion of each process chamber 110 tangentially to and along the curved surface 102 via the inlets which are located on top of the tool head 50. The gas then flows radially outwards in the chamber and is discharged from the outermost portion of each chamber in a vertically downward direction via the gas outlets 106 arranged on a lower portion of the peripheral sidewall 108 of tool 100. Each curved surface 102 of barriers 101 extends for a majority, and substantially the entirety of the radial length of the separating barriers 101 in some embodiments. In addition, each barrier has a slight angular twist in configuration about its radial centerline Rc as shown. Collectively, the twist and arcuately surfaces define separating barriers 101 which may be considered to have partial spiral walls or bodies in shape. The arcuately curved and spiral separating barriers 101 reduce gas flow turbulence and vortices within the chambers which is undesirable for film deposition uniformity. The separating barriers 101 converge and meet at central housing hub 107.

FIGS. 10-13 show another alternative embodiment of HPS-CVD reactor or tool 120 which instead is of a modular system design. On its face, the modular tool unit 120 is similar to HPS-CVD reactor or tool 20 previously described herein such as the gas introduction and exhaust flow to each process chamber and configuration of the gas flow path through the process chambers. However, in the present modular design, the pressure retention and process chambers are separated and provided in two complementary configured parts which may be detachably coupled and interlocked together—an outer shell 130 and separable internal process insert 131. The shell and insert may each be considered to define an enclosure in a broader sense.

Figure 10:
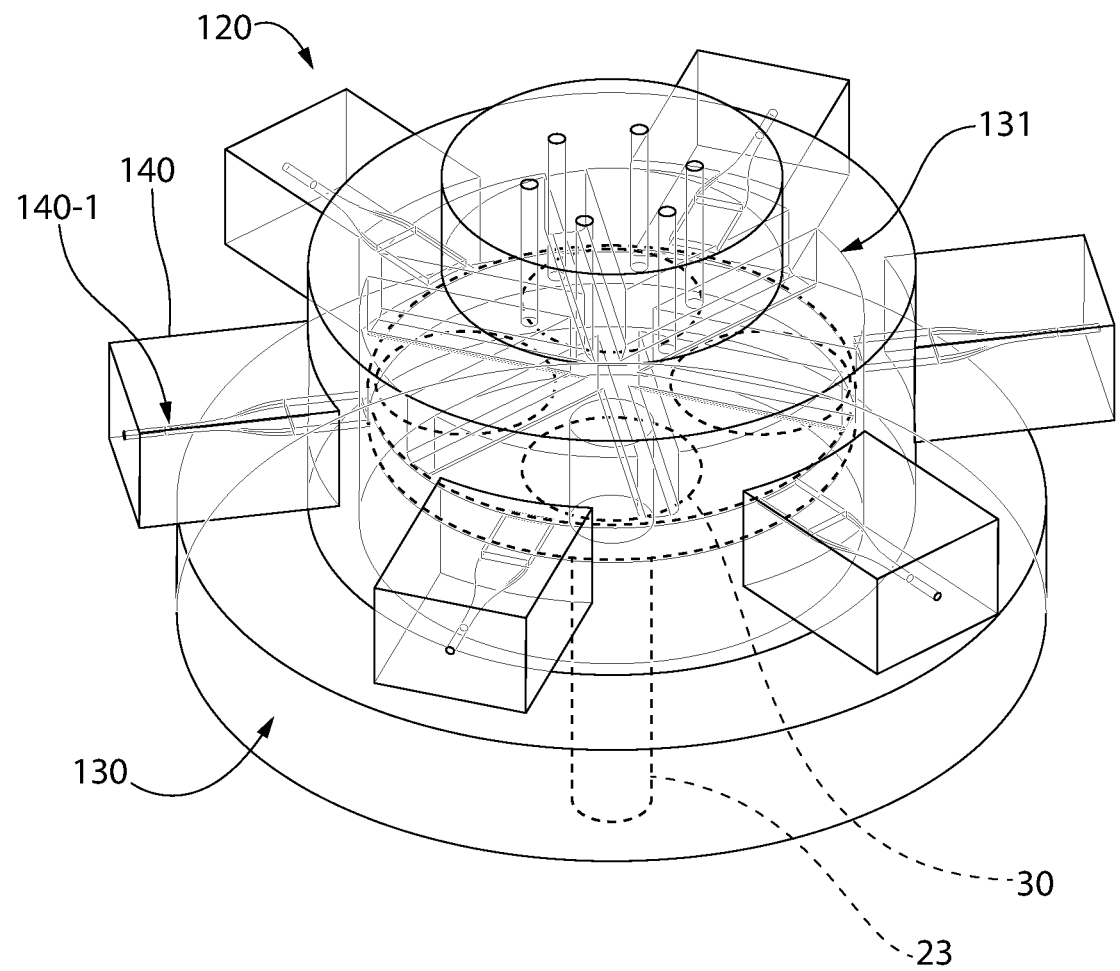
FIG. 10 is a perspective view of a modular embodiment of a HPS-CVD reactor or tool showing an assembly comprising an outer pressure retention shell and inner process insert.

Process insert 131 defines a downwardly open substrate cavity 131-1 for receiving the pedestal platter 23-2 and wafer 30 therein. This is best shown in FIG. 10 which is a perspective view in phantom lines of entire assembled modular tool unit. Whereas the outer shell 130 is constructed and designed for the pressure retention function (e.g. >1 atm), the insert 131 defines the separating barriers 121 and process chambers 122 for depositing the thin film on the wafer 30.

The common shell of the modular HPS-CVD system forms the platform which accepts multiple different interchangeable and interlockable process inserts each having a different configuration, chamber and barrier design, and flow dynamics and characteristics. This allows the modular system to be highly customized for the particular types of sources gases and volatile reactive species required to form different compositions of thin films to be grown on the substrate. Examples of some interchangeable process inserts which can be used with the common shell are describe below and shown in FIGS. 14-20.

Figure 11:
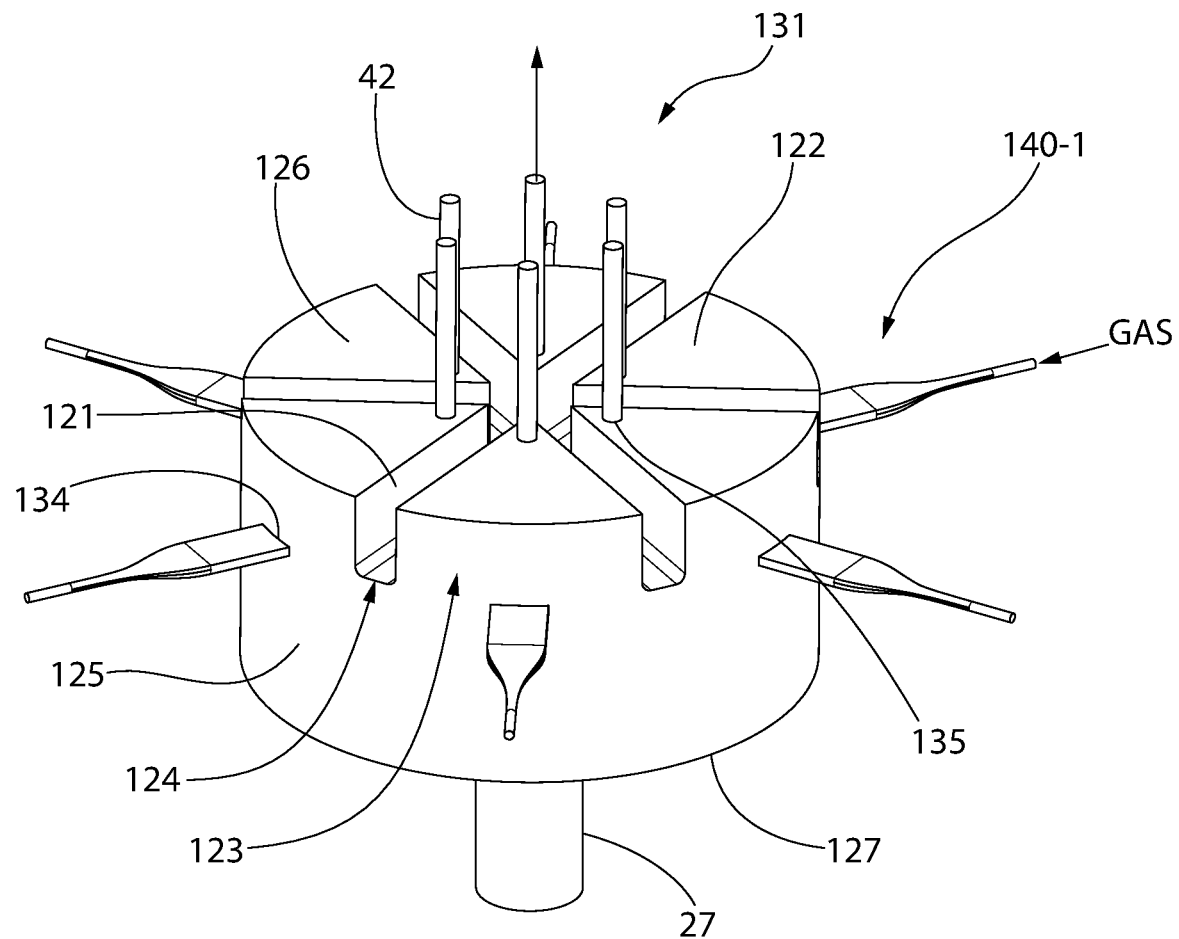
FIG. 11 is a perspective cross-sectional view of the process insert of FIG. 10.
Figure 12:
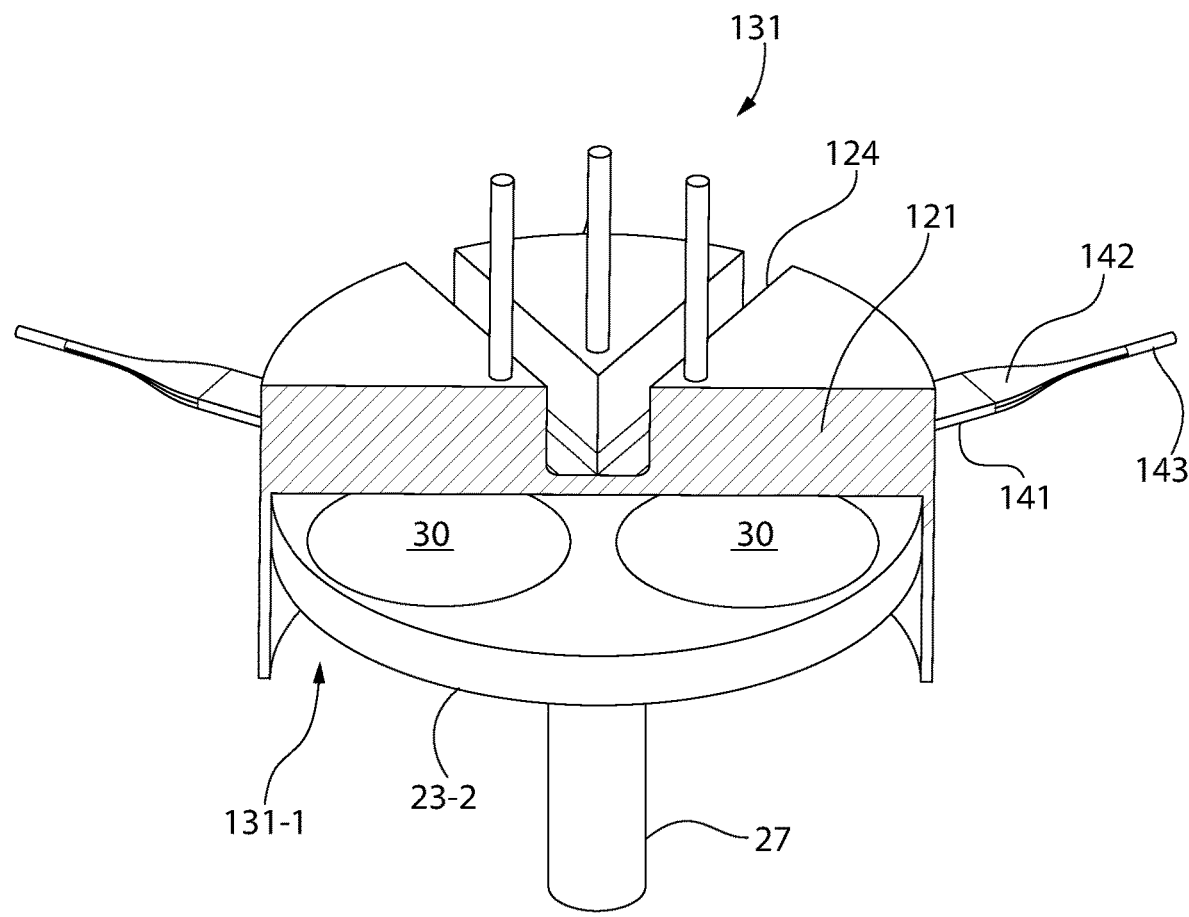
FIG. 12 is a perspective cross-sectional view thereof.
Figure 13:
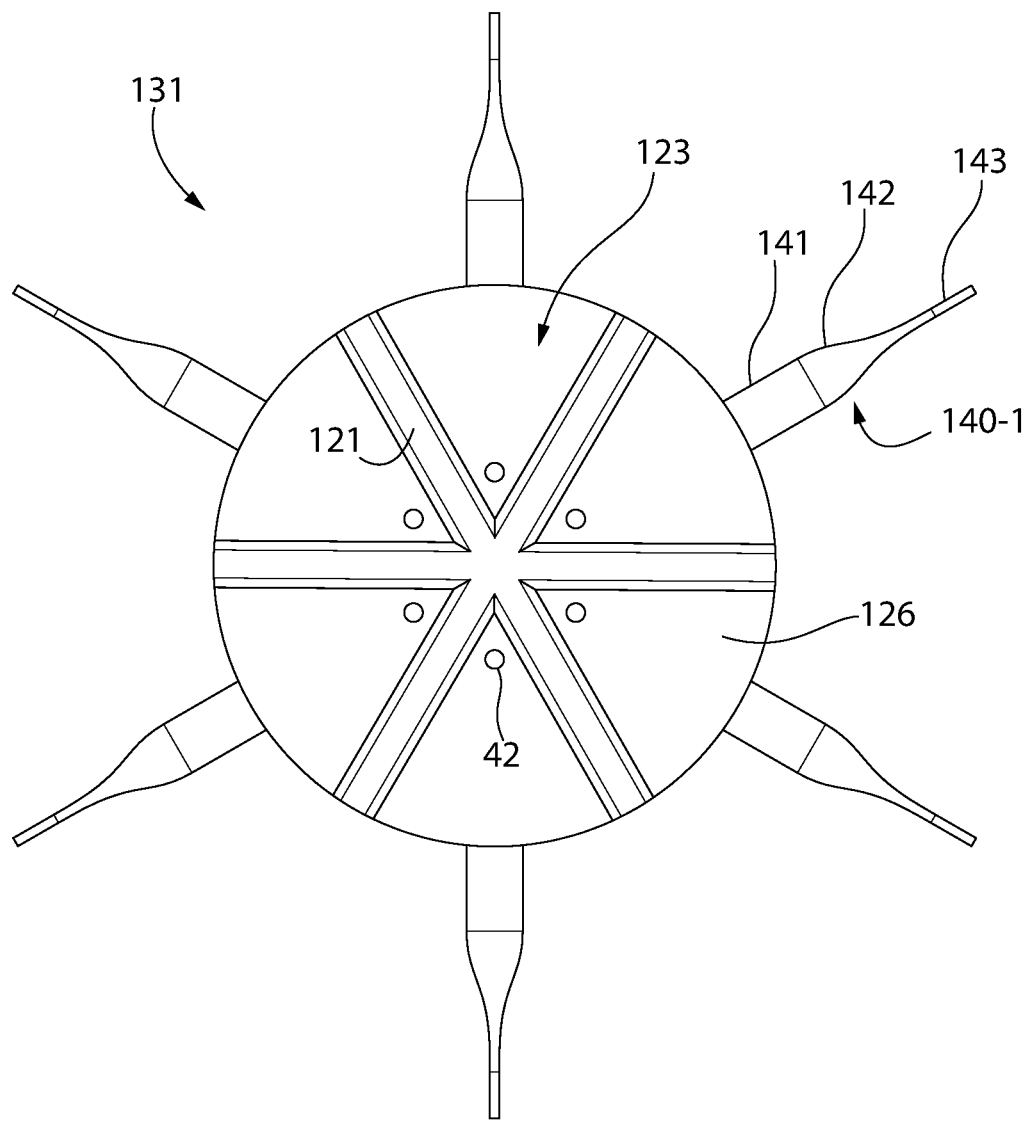
FIG. 13 is a top plan view thereof with top wall removed to reveal internal structures.

FIGS. 11-13 show the present process insert 131. Process insert 131 includes a top wall 126, sidewall 125 extending downwards therefrom, and a bottom edge 127 defined by the sidewall. A plurality of radially extending and upwardly open interlock recesses 124 are formed in the top wall. This defines wedge or pie-shaped sectors 123 which in turn create the separating barriers 121 and process chambers 122 inside the insert. Recesses 124 each receive a corresponding locking rib 132 which extend downwardly from the top wall 136 in the downwardly open internal cavity 133 of the outer shell 130 (see, e.g. FIG. 14). This locks the process insert 131 rotationally inside the cavity 133 to properly orient chamber gas inlet and outlet ports 134, 135 in the body of the insert 131 with the gas inlets 141 and outlets 42 formed on the outer shell 130.

Figure 14:
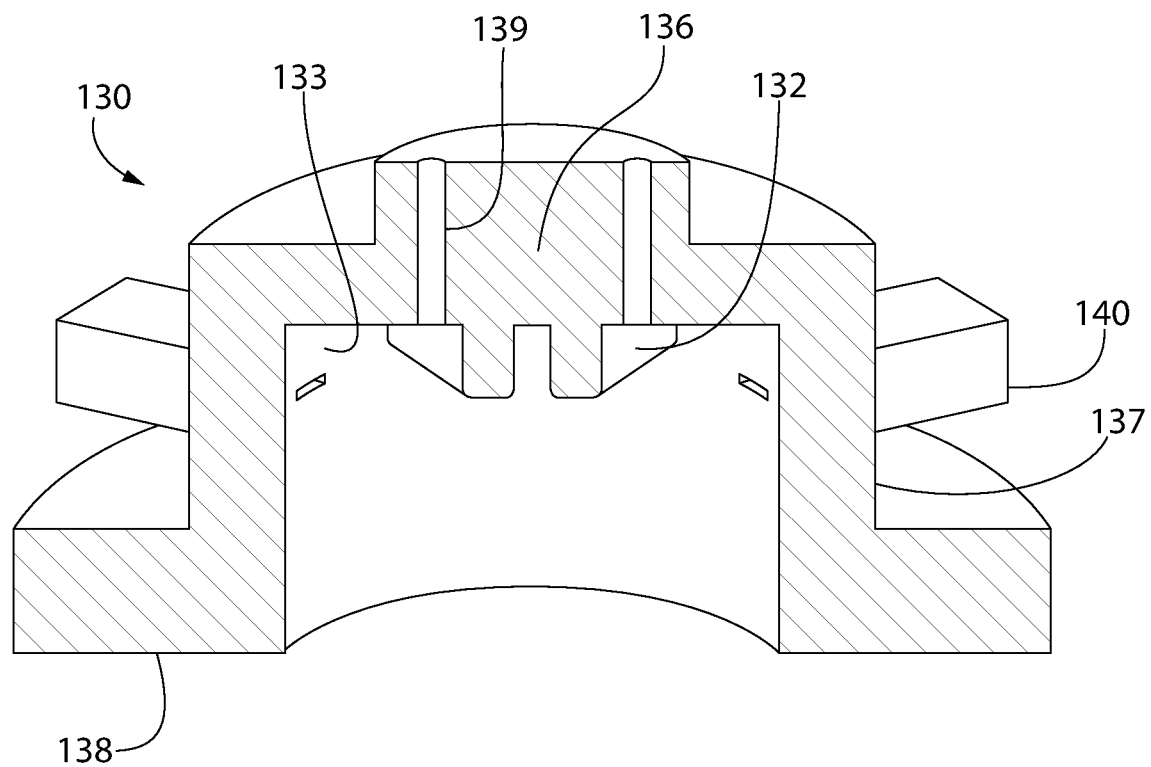
FIG. 14 is a cross-sectional perspective view of the outer shell of FIG. 10.

FIG. 14 shows the outer pressure retention shell 130, which includes top wall 136, bottom wall 138, and sidewall 137 extending therebetween. The gas inlets 140 are radially oriented and define an internal flow channel 140. Channel 140 may have a compound configuration including an laterally widened inner section 141 of rectangular cuboid configuration with opposing straight sidewalls which penetrates process chambers 122 in the process insert 131, intermediate flow increaser 142 with diverging sidewalls which forms a flow transition that gradually widens in width moving radially inwards to more gradually increase the width of the internal flow channel 140 for promoting laminar flow, and an outer cylindrical section 143 for coupling to the gas supply system 60. Each gas inlet may protected inside a block-shaped outer casing which projects radially outwards from the sidewall 137 of the outer shell 130. The tubular gas outlets 42 extending vertically upwards from the process insert 131 are received in longitudinal bores 139 formed in top wall 136 of outer shell 130.

It bears noting that any of the HPS-CVD reactors or tools describe herein may be provided as a modular design (e.g. tools of FIG. 1 or 6) by providing an outer pressure retention shell 130 and process insert configured with chambers and separating barriers similar in design to those already described. Accordingly, the invention is expressly not limited to one or two piece reactor designs.

FIGS. 15-18 show a another alternative embodiment of a modular HPS-CVD reactor or tool 150 comprising pressure retention outer shell 130 described above and inner process insert 162. Similarly to tool 120, process insert 162 has a generally cylindrical body including top wall 151, bottom wall 152, vertical sidewall 153, and downwardly open cavity 163 for receiving the pedestal platter 23-2 and wafer 30 therein. In this embodiment, the separating barriers 154 have simple blade shape which includes an untwisted arcuately curved surface 157 extending between top and bottom radial edges 155, 156 of the blade. The curved surface 157 is angularly untwisted about the radial centerline Rc of the barrier. Barriers 154 extend radially from sidewall 153 to central hub 164. In this embodiment, both the gas inlets 158 and gas outlets 159 are on the top of the process chambers 160. The inlets are in a radial outermost portion of the chambers and the outlets are in the radial innermost portion adjacent to central hub 161. Gas flow is in a U-shaped flowpath through the chambers 160.

Figure 19:
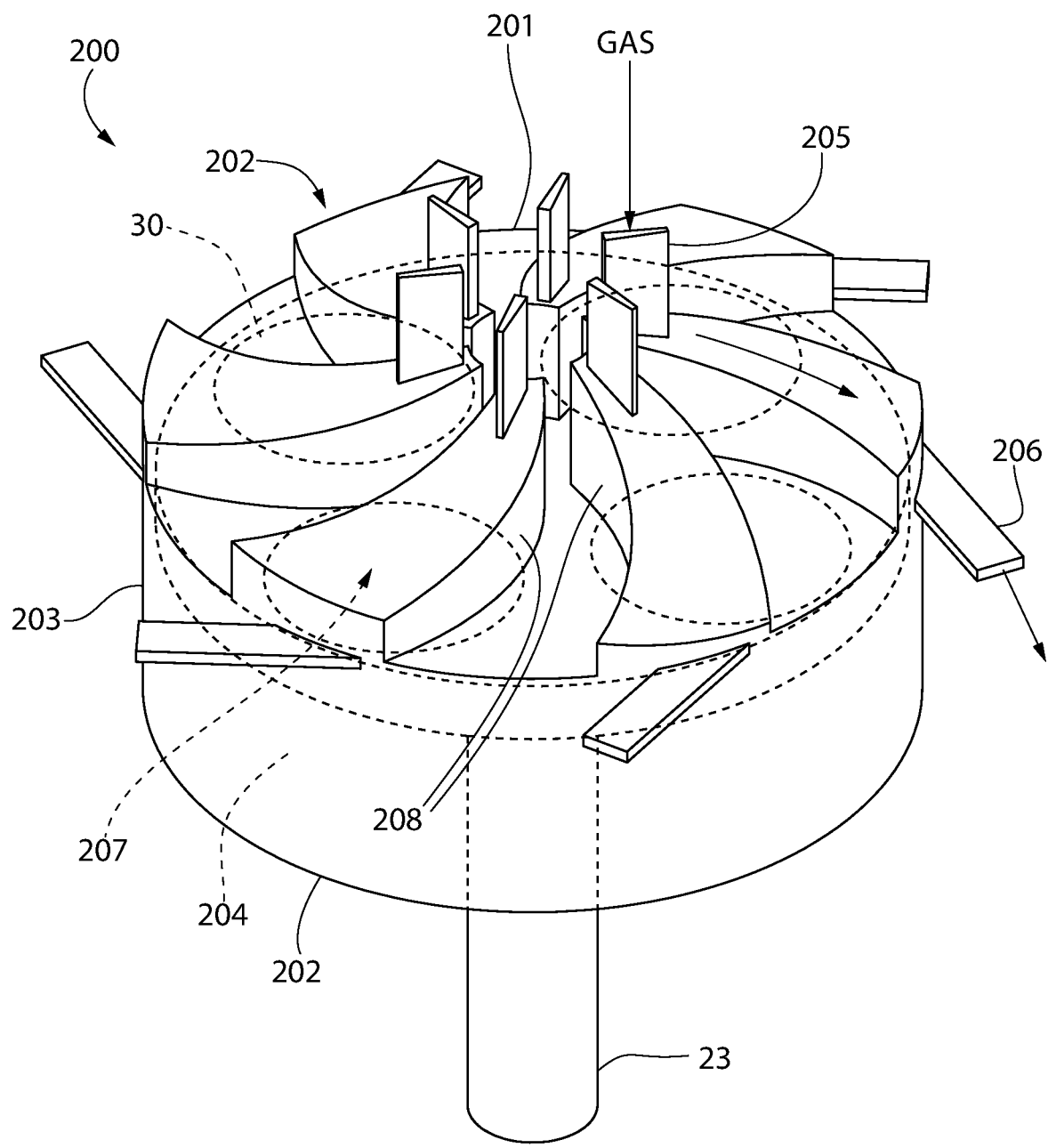
FIG. 19 is a perspective view of a third modular embodiment of a HPS-CVD reactor or tool showing an assembly comprising an outer pressure retention shell and inner process insert.
Figure 20:
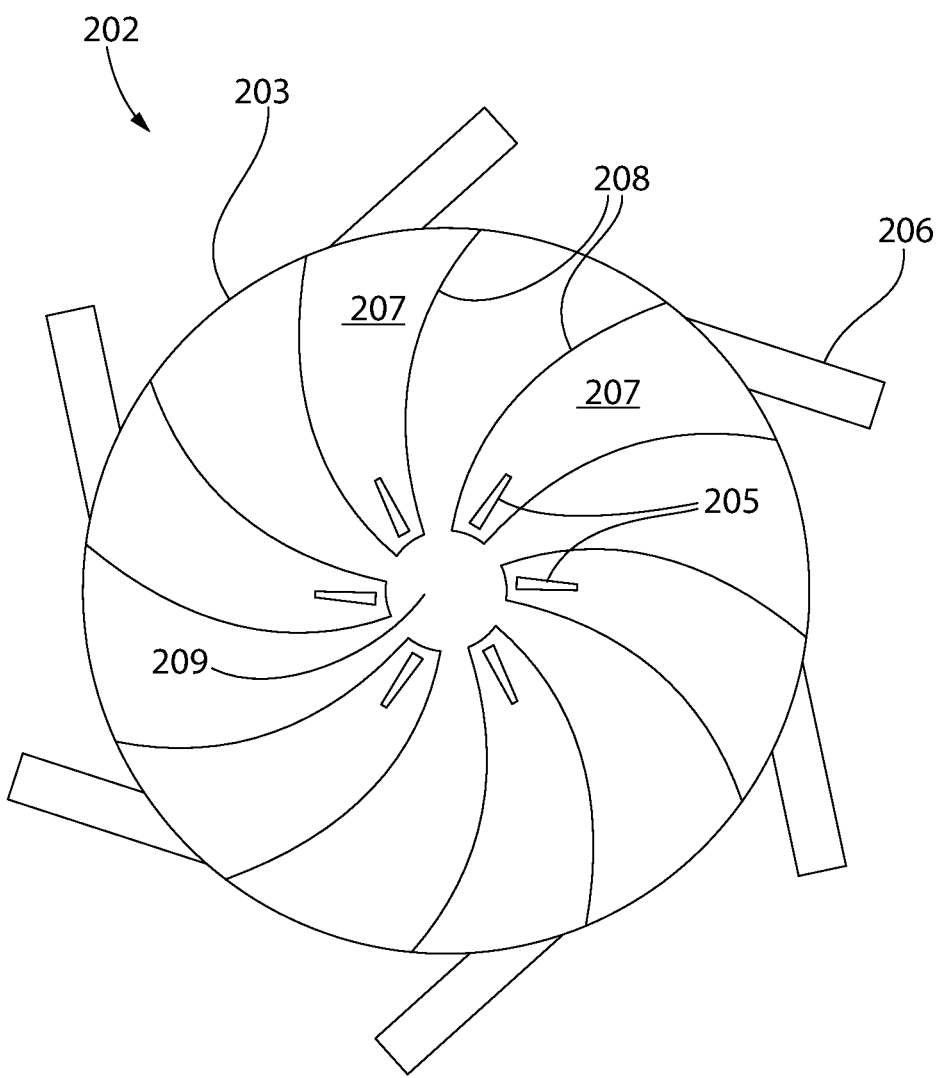
FIG. 20 is a top plan view thereof with top wall removed to reveal internal structures.

FIGS. 19-20 show another alternative embodiment of a modular HPS-CVD reactor or tool 200 comprising pressure retention outer shell 130 described above (not shown in present figures for brevity) and inner process insert 202. Similarly to tool 120, process insert 202 has a generally cylindrical body including top wall 201, bottom wall 202, vertical sidewall 203, and downwardly open cavity 204 for receiving the platter of pedestal 23 and wafer 30 therein for processing. In this embodiment, the separating barriers 208 which define chambers 207 therebetween have a spiral shape in top plan view (see, e.g. FIG. 20). The radial side surfaces of the barriers may oriented parallel to rotational axis Ra of the tool. Barriers 208 extend in an arcuately curved manner in the radial direction from sidewall 203 to central hub 209. In this embodiment, both the gas inlets 205 are on the top of the process chambers 207 and gas outlets 206 are formed in the sidewall 203. Gas outlets 206 are arranged to discharge gas radially outwards from the chambers in a substantially tangential orientation to the sidewall 203. The inlets are in a radial innermost portion of the chambers and the outlets are in the radial outermost portion of the chamber. Gas flow is in an arcuately curved L-shaped flowpath through the chambers 207.

Process sampling and real-time data measurements may be provided in some embodiments to continuously monitor the film growth process and parameters. In one implementation, one of the process chambers may be dedicated for use as a testing chamber which may be identical in configuration to the gas source process chambers, or different. The testing chamber is equipped with instrumentation, sensors, and/or analyzed for conducting in situ analysis of the process. Parameters such as system operating pressure, temperature, film chemical composition, etc. may be monitored using suitable commercially-available instrumentation. The testing equipment may be operably and communicably linked to programmable system controller 70 for automatically monitoring the HPS-CVD process in real-time.

Some aspects and advantages of the present HPS-CVD reactor or tool and related film formation process are summarized below.

Advantageously, growth of crystalline layers or films on the wafer substrate using the present invention may occur at significantly higher pressures than prior commercially available standard CVD methods and at higher pressures than existing CVD tools available on a research scale. This permits growing materials at higher temperatures (which permits higher crystal quality and hence device performance or may enable growth of certain material systems altogether). Additionally, less explored aspects of this invention include the ability to control the phase of the material grown by changing the total system pressure of the system or using precursors which are preferentially stabilized at elevated pressures.

Actual design of various aspects of the HPS-CVD tool may be modified in other embodiments (e.g. mechanism of rotating carrier wafer in-between individual sectors of the tool or other). Additional modifications of the present HPS-CVD system design could lead to individual sectors performing other actions than providing materials in the gas phase, such as, but not limited to, providing in situ monitoring techniques or introducing reactive species in plasma. Due to the wide range of pressures now accessible using the present HPS-CVD system design and related method, a variety of traditionally decomposition-limited materials can now be accessed. Furthermore, integration of dissimilar materials as sequential growth steps can now performed, permitting development of layers exhibiting, for example, multi-ferroic behavior on a wide-band gap semiconductor material. This can be readily achieved by introducing individual sectors with reactive species or with inert gas. This would permit modulation of the gas flow, providing an additional dimension for process development. Additional modifications also encompass changes in size and distribution of the process chambers leading to chambers which are not uniform, identical or geometrically similar to each other. In the most similar embodiment, one chamber size would be larger than the other, forming a larger pie slice than the other.

The present HPS-CVD reactor thus advantageously enables high quality, high efficiency growth of materials using vapor phase sources materials. Operation at high pressures permits growing materials at high temperatures prior to their decomposition or degradation. Spatial separation of the gas/vapor sources minimizes pre-reaction in the gas phase, increasing the utilization of the sources and their incorporation into the growing crystal. Capability of growing materials which have been decomposition limited, meaning high enough temperatures could not previously be achieved for these materials prohibiting their growth using this class of techniques.

Increasing the density of a fluid inevitably leads to an increase in intermolecular interactions. This has two main drawbacks: (a) enhanced rate of gas phase chemical reactions of precursors leading to undesired adduct or new compound formation and loss of precursor for crystal growth, and (b) a reduction in rate of mass-transport of desired species due to a reduction in diffusion coefficient. Increasing the density of a fluid typically also leads to enhanced instabilities and turbulence. In the present HPS-CVD reactor, each gas inlet carries molecules which do not react with each other (no mixing of precursors) and the gas inlet geometry can be tailored to the specific gas properties to ensure laminar flow over the wafer. If desired, the inlet channels may be cooled to prevent premature decomposition of the precursor or heated to prevent condensation of vapors.

Exposing the crystal to different individual precursor chambers is achieved by continuously moving a wafer between them. This is achieved by placing the wafer completely off-center on a rotating pedestal. The path traveled by the wafer therefore sequentially exposes the wafer to the chemistry present in each individual gas chamber and continuous growth of the desired material is achieved. Changes in composition of the growing material is primarily achieved through changing the inlet gas composition and not necessarily through changes in rotational speed, though this will also be investigated. Continuous purging of the individual gas chambers ensures the byproducts of the growth reactions are removed and consistent, repeatable growth conditions exist.

Certain electronic devices such as power electronic devices take advantage of thick layers of material to, for example, drop a large voltage across. The limiting factor typically being the breakdown voltage of the material at hand. In the case of GaN, this translates to a need for thick (>few micron) layers of GaN material grown using the same process as the thin films (few 10 s or 100 s nm thick) made up of preferentially doped or otherwise different composition material. To obtain thin layers with high control over the impurity incorporation requires slow growth rates. To perform thick growths of material using the same process, however, hence requires long growth campaigns >6 hrs in length, which results in appreciable cost and lower productivity.

The HPS-CVD process provides a new mechanism to modify the growth rate of the material by increase or decreasing the operating pressure of the system via the gas supply. As such, at higher pressure, more materials (reactive species) can be transported into the chamber and incorporated into the wafer. This leads to higher growth rates. To reduce the growth rate, the same apparatus simply needs to reduce the growth pressure, thereby reducing the amount of delivered reactive species and in doing so can provide the required control over the growth of the thinner film parts of the electronic device. As such, the HPS-CVD tool can, during the same growth run and without having to expose the wafer to another tool, chamber, or external environments, be able obtain high quality, thick layers of matter (>10 microns) and thin layers (<1 microns). Traditional CVD systems cannot readily switch from high growth rate conditions to low growth rate conditions due to design constraints of the chamber and associated fluid dynamic considerations. Conditions required to obtain thick and thin layers in conventional systems either require the use of two separate, differently designed systems/tools and transferring the wafer between the tools thereby introducing impurities and other growth related challenges, or by extending the growth run time, thereby dramatically increasing cost and production time.

The present HPS-CVD tool can therefore be simultaneously used during the same growth run, to alternatingly obtain both thick layers of matter and thin layers by selectively modulating the tool operating pressure for different periods of times or intervals during the run within the same tool/system, thereby addressing the different film formation needs during their growth. This type of process and film formation flexibility cannot be readily matched by traditional CVD systems.

As an example of this use, the following process can be envisioned to grow a thick: 10 micron thick layer of high purity GaN, followed by a thin layer (100 nm) of n-type GaN or p-type GaN. The HPS-CVD would operate at elevated pressures of 5-100 atm with a high concentration of reactive species Ga (TMGa) in the system. Combination of high pressure ammonia and TMGa results in the rapid growth of a thick GaN film of 5-100 micron film thickness at a growth rate of 0.01-10 micron/min. After the growth layer is obtained, the system growth pressure is reduced to 1-5 atm and a thin film of n-type or p-type GaN is subsequently grown during the same process run at a rate of 0.001-0.01 micron/min for a thickness of 10-2000 nm. To achieve n-type GaN, in addition to TMGa, a chamber is preferentially filled with a reactive species containing silicon. To achieve p-type GaN, in addition to TMGa, a chamber is preferentially filled with a reactive species containing magnesium. The growth temperature of the wafer may be maintained at a substantially constant value for both the high and low growth rate period, or may be modified to optimize the growth conditions. The typical process temperature range is between 800-1200 C.

It bears noting that operating pressures and growth rates of the present HPS-CVD process may be alternated and varied two or more times during a single growth run for periods of time to sequentially form multiple thicker and thinner films of material thereby creating the composite material film on the substrate. For example, a thinner film of a first type material or composition may first be grown, following by a thicker film of a second type material or composition thereon, and then followed by a final thinner film of a third type material or composition thereon. This film deposition sequence occurs during the same process run using the HPS-CVD reactor or tool. Accordingly, the HPS-CVD tool and process advantageously allows many types of composite films to more easily and quickly formed in less time than conventional CVD approaches.

Process Pressure Modulation

As noted above, varying and modulating the operating process pressure of the material deposition apparatus may be used during a single growth run to change thicknesses in the individual material film layers being grown on the substrate, to alter the nature and characteristics of the film being grown, or to form various structures in the film layers undergoing formation.

As one non-limiting example, destabilization of a film can result in catastrophic deterioration of the film, or if performed in a controlled manner, can advantageously lead to the controlled formation of features in or on the film. Such features include without limitation the formation of nano-scale crystalline structures in the film such as nanodots including quantum dots (semiconductor nanocrystals with certain optical/electronic properties) in the film material. For example, growth of a high indium content film, say InGaN with 80% indium, can grow high quality films with a few 10 s atm of nitrogen source gas pressure over the film. A reduction in pressure however to, for example 1 atm, after the film is grown and still at high temperature will result in the partial decomposition of this alloy, leading to an enrichment or clustering of indium and gallium in certain regions of the film material. Once the film cools to room temperatures, it is thought likely that the material is kinetically constrained and unable to decompose in this fashion. Strain engineering, which is a known process in the semiconductor arts, can then be used to preferentially consolidate the alloy material formed in a periodic arrangement with desired pitch spacing. A subsequent increase in pressure of nitrogen will then stabilize the InGaN material again and the regions that experienced partial or complete decomposition will nitride again advantageously leading to heterogeneity in alloy composition and hence electronic/optical properties. To further control the alloy composition in the preferentially decomposed regions of the material, an etchant can be introduced in the gas stream that preferentially reacts and removes one or more of the materials present on the surface of the film leading to a further enhancement in difference in alloy composition between different regions of the material providing, for example, enhanced confinement of carriers or photons, to nano or micron-scaled features of the material (e.g., nanodots).

An additional example of the uses of process pressure modulation or variation in the HPS-CVD tool 20 includes pressure pulsing using cyclical pressure waves such as brief short periods of high pressure vs. low pressure states over a timed schedule which are rapidly repeated multiple times in succession over a period of time during the film formation process. The pressure modulation schedule, magnitude of the pressure increases/decreases in the process chambers 51, and a corresponding pressure change profile can be preprogrammed into controller 70 which automatically implements pressure modulation according to the schedule. This process could, for example, result in growth of high-pressure and low-pressure indium content films with a fine-scale interdigiting structure such as the formation of multiple quantum wells with higher indium content thin films being the wells and lower indium content thin films being the barriers. This results in emission of longer wavelength light from the wells due to enhanced confinement of the carriers into these regions due to the lower indium content films having a larger bandgap and the higher indium content regions.

Furthermore, pressure modulation would permit growth of a device structure in the film, such as an LED at a constant wafer temperature and control over the indium content in the quantum well which would be primarily controlled by changing the indium precursor concentration and pressure of the system.

Additionally, the shape of the preprogrammed pressure change profile in the substrate film formation system can directly translate to the shape of the alloy composition profile of the film being grown. For example, a sawtooth shaped pressure change profile of pressure increases and decrease in the process pressure of the process chambers 51 will result in a matching profile in indium or another metal or alloy composition in the grown film. This can be further enhanced via coordination and coupling with an associated change in one or more precursor concentrations in the source gas flow. The pressure pulses or modulation reflected in the pressure change profile may have any desired functional form (step function, sawtooth, sinusoidal, etc.) which will create a complementary configured profile in the metal or alloy composition in the film.

In another film formation example, as noted previously, increasing the nitrogen, ammonia, hydrazine, or other nitrogen-containing molecule pressure in the system allows the stability of the growing nitride film to be stabilized. This permits growth at higher temperature prior to decomposition or modification to defects that emerge during growth. By changing the pressure during a growth, one can control the stability of these materials in situ during a run and preferentially stabilize or intentionally destabilize a material to form features on the film such as nano or quantum dots or other features/structures via a pressure increase or decrease, respectively.

Figure 21:
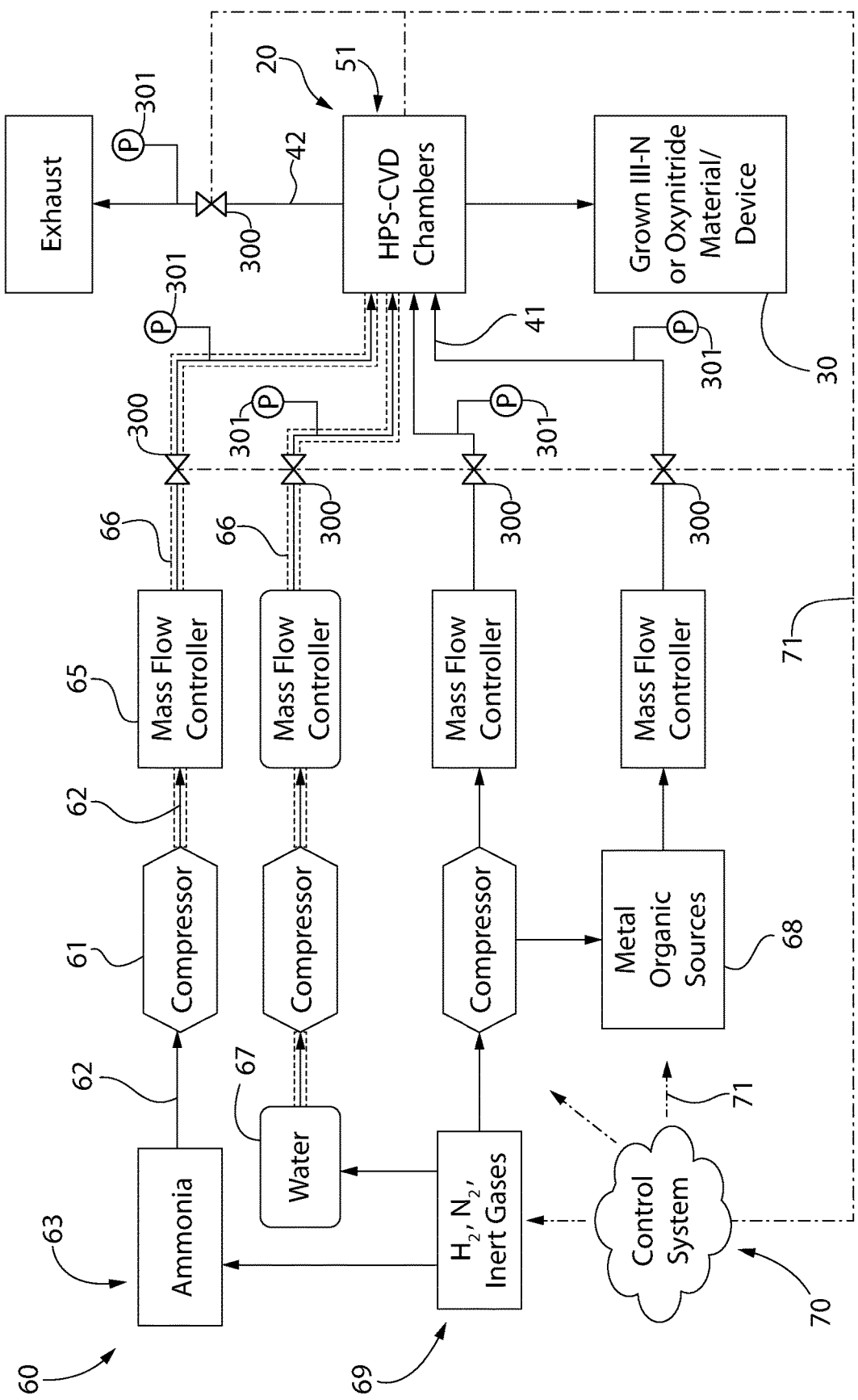
FIG. 21 is the schematic block diagram of the gas supply system of FIG. 5 showing one embodiment of a mechanism for controlling gas pressure in the tool.

To implement pressure modulation to form the above type films and structures on the substrate, HPS-CVD tool 20 process pressures may be adjusted via operation and control of the gas supply system 60 which controls injection of the individual source gases with volatile reactant species into each of the process chambers 51, thereby creating the resultant overall operating pressure in the tool. FIG. 21 is a modified schematic block diagram of the gas supply system of FIG. 5 showing addition of one non-limiting embodiment of gas pressure controllers or regulators for controlling and adjusting the source gas injection pressures of the HPS-CVD tool 20.

The gas pressure controllers/regulators in one embodiment may be pressure regulating valves 300. Valves 300 are fluidly interposed after the mass flow controllers 65 (downstream) and before (upstream of) each process chamber 51. The pressure regulating valves are therefore each fluidly coupled between the mass flow controllers and gas inlets 41 of process chambers; each process chamber therefore having an associated upstream pressure regulating valve for controlling the source gas pressure in the chamber.

Additionally, a pressure regulating valve 300 can be added and fluidly coupled to the gas outlet 42 of each process chamber 51 to add back pressure to the exhaust flow from each process chamber which advantageously further enhances control for changing and modulating process pressures in the HPS-CVD tool 20 during various stages of the composite film formation on the substrate (e.g., wafer 30). The gas outlet pressure regulating valves can be provided in addition to the gas inlet pressure regulating valves described above, or instead of in various embodiments.

The pressure regulating valves 300 permit modulation of process pressures during a single process run for forming film layers and various features on the support structure as described above. Either set of pressure regulating valves upstream or downstream of each process chamber, or both upstream and downstream of each process chamber, can be used to control the gas pressure in each chamber either from the gas inlet side and/or the exhaust side of the chamber.

Any commercially-available gas pressure regulating valve suitable for the present pressure modulation scheme may be used for the pressure regulating valves 300.

Control of the gas supply system including the pressure regulating valves 300 may be accomplished by programmable controller 70 in the same manner previously described herein with respect to the system shown in FIG. 5. Accordingly, the pressure regulating valves 300 are operably coupled and communicably linked to the programmable controller 70 similar to the mass flow controllers 65 and other gas supply system equipment shown. The controller is configured via programming to direct and synchronize operation of the pressure regulators to modulate the process pressure in the process chambers 51 of the tool 20 in a sequenced manner according to a preprogrammed pressure change profile which varies with time. Various sequential periods of time each having an associated or corresponding pressure value setpoint which may be preprogrammed into the controller 70 (e.g., a "process plan"). The controller then automatically implements formation of the film on the wafer 30 which gradually grows in thickness by controlling injection/feed mass flow rate of the various reactant source gases into their respective process chamber 51 at the preprogrammed pressures and for the preprogrammed periods of times to build the composite film. The controller may monitor the gas pressures downstream of the pressure regulating valves 300 via a plurality of pressure sensors 301 shown in FIG. 21. Any suitable commercially-available pressure sensor may be used. The pressure sensors are operably and communicably linked to the controller to transmit a measured real-time or actual gas pressure thereto. The controller compares the measured actual pressures to the preprogrammed setpoint pressures, and adjusts the pressure regulating valves 300 accordingly until the setpoint pressures are achieved.

It is well within the ambit of those skilled in the art to program the controller with the desired time periods, pressures, and gas injection sequencing to build the desired film and any structures intended thereon (e.g., nano or quantum dots, interdigitated array (IDA) electrodes, or others) in order to implement the process plan.

It bears noting the controller 70 controls and changes the pressure in each process chamber 51 and the resultant overall HPS-CVD tool pressure in a dynamic manner while the substrate continues to translate in the circular path beneath the process chambers during a film formation process run. The individual source gases continue to be injected into the process chambers while the pressure transitions from one pressure state to another pressure state. Accordingly, the tool continues to process the substrate (e.g., wafer 30) during the pressure change or transition.

An exemplary method for forming a film on a substrate may comprise: translating the substrate in a circular path through a plurality of process chambers of a material deposition apparatus, each process chamber containing a different source gas comprising a volatile reactive species; consecutively exposing the substrate to the process chambers in a sequential manner as the substrate translates in the circular path; forming a first film layer on the substrate at a first pressure during a first period of time; and forming a second film layer on the first film layer at a second pressure during a second period of time, the second pressure being different than the first pressure; wherein the film gradually grows in thickness on the substrate with each successive pass and exposure of the substrate to the volatile reactive species in the source gases of the process chambers. The method may further include: forming a boundary layer adjacent to the substrate beneath the process chambers; and mixing the source gases from each process chamber in the boundary layer; wherein the source gases are partially reacted when exposed to the substrate with each pass allowing the source gases including some unreacted gas to carry over in the boundary layer to the next succeeding chamber for reaction.

Process Boundary Layer Modulation

As previously described herein, the thickness of boundary layer 53 set by the separation distance D1 (see, e.g., FIG. 4) can be dynamically varied throughout the crystal layer or film formation run to provide run-time optimization of the fluid flow (sources gases) and changes to varying gas compositions and system pressures throughout crystal growth. D1 therefore affects the system process pressure as well as the thickness of the boundary layer.

Manipulating the boundary layer thickness can provide various advantages. For example, by opening the boundary layer up (i.e. increase D1), it is possible to purge the system of gases more rapidly allowing, for example, a purification step of the system. This could entail coordinating shut off of a precursor (say for example a dopant, Mg or Si, or an alloy constituent Al, In, or Ga) combined with an opening of the boundary layer. This will result in the rapid removal of the element from the system yielding a sharp material interface between a doped or alloyed region and that without it. The concept is to have a region of material with a high concentration of an element and a region with a lower concentration. This could be doping and/or alloy element (e.g. Mg, Si or Al, In, Ga). The growth process is implemented for example to grow one film with (or without) the species and then flush the system of that species, followed by growth of a film layer without that element present. This results in a sharp transition between the initially grown layer and that following the purge step.

Changing of the boundary layer thickness combined with a change in inlet velocity of the source gases can also be used to modify the flow pattern in the chamber leading to an enhanced recirculation of the chamber or improved removal of species from the chamber. This approach can be further combined with a change in precursor concentration in the flow stream. An enhancement in turbulent flow will temporarily enhance mixing of the gases and led to a more uniform distribution of species in the chamber. Additionally, it will also enhance the removal of a carrier of the complete elimination of precursor is desire and pure gas is introduced in the chamber.

Regularly modulating the boundary layer thickness will result in changing the arrival rate of the precursors to the wafer surface and hence change the alloy composition as desired. This can be used to gain further control over the alloy or dopant/impurity concentration in the film. Additionally, if a precursor is used that requires preferential interaction in the boundary layer to "activate" it or change its chemical nature to one more preferred for incorporation in the film, the boundary layer can be temporarily increased to increase the diffusion time to the wafer surface and hence time of residence for mixing and precursor pre-reactions to occur.

As previously noted, in one embodiment, a suitable commercially-available mechanical, electric motor-driven, or pneumatic/hydraulic adjustment mechanism 250 (shown schematically in FIG. 1) may be operably coupled to the pedestal rotor 27 to raise or lower the pedestal 23 and susceptor (supported by the pedestal) relative to the head 50 and barriers 52 fixed thereto and process chambers 51, thereby allowing distance D1 and concomitantly thickness of the boundary layer 30 to be dynamically varied and adjusted as needed in situ during a single process run. A linear actuator (e.g., electric motor, pneumatic, or hydraulic driven) may be used in some embodiments for the adjustment mechanism. In other embodiments, the adjustment mechanism 250 may be operably coupled to the stationary lower housing 26 (which supports the rotating pedestal 23) to raise or lower the lower housing 26 and pedestal/susceptor to adjust the boundary layer thickness (distance D1). Alternatively, in a preferred but non-limiting embodiment, a relocated adjustment mechanism 250A, which may be a linear actuator located above or adjacent to the head 50 (shown schematically in dashed lines in FIG. 1), could be operably coupled via a linearly movable drive rod 250B to the head to instead raise/lower the head relative to the pedestal 23 and susceptor 22 which may remain vertically stationary to adjust boundary layer thickness (distance D1). All of the foregoing adjustment mechanism 250/250A coupling arrangements achieve the same end result of providing a mechanism for increasing/decreasing the boundary layer thickness via the adjusting the separation distance D1. In some embodiments, both adjustment mechanisms 250 and 250A may be provided.

Adjustment mechanism 250 may be operably and communicably coupled to programmable controller 70 which can actuate the mechanism to increase/decrease distance D1 and the boundary layer thickness automatically according to a preprogrammed process plan which changes over time, and which can be coordinated by the controller with the preprogrammed process plan for the timing and injection of the source gases and control of the process pressure in the HP-CVD tool 20 as previously described herein.

EXAMPLE

Following is a non-limiting example of modulating both the process pressure and boundary layer thickness in the HP-CVD tool 20 during a single process run to form multiple film layers on a substrate.

In this example for modulation of boundary layer thickness and process pressure, the growth of a high indium content InGaN or AlInN layer can be pursued as follows. A first layer of GaN or low-indium content InGaN, AlInN is grown on a wafer at low pressure (for example 1 atm) and a relatively large boundary layer thickness (for example 10 mm) For growth of the high indium content film, the pressure is increased in the system to 100 atm, and the boundary layer is reduced to 5 mm Under these new higher pressure and thinner boundary layer thicknesses, the high indium content film is grown. To cap the high indium content film, a third layer can be grown with a lower indium content film. This film would be grown, for example, under the high pressure and smaller boundary layer conditions to stabilize the high indium content film. This third layer could contain little or no indium. Once the third film is grown the pressure in the system can be reduced again and the boundary layer size increased to grow any additional films on the device. This example, with proper incorporation of dopants could lead to a simple LED device with the first film being n-type doped (with little to no indium), the high indium content film grown without any intentional doping and the third film being p-type doped (with little to no indium).

The foregoing process steps may be preprogrammed into controller 70 which controls the process pressure via the gas supply system shown in FIG. 21 and boundary later thickness (distance D1) via operating adjustment mechanism 250 or 250A to complete the composite film from start to finish.

While the foregoing description and drawings represent exemplary ("example") embodiments of the present invention, it will be understood that various additions, modifications and substitutions may be made therein without departing from the spirit and scope and range of equivalents of the accompanying claims. In particular, it will be clear to those skilled in the art that the present invention may be embodied in other forms, structures, arrangements, proportions, sizes, and with other elements, materials, and components, without departing from the spirit or essential characteristics thereof. In addition, numerous variations in the methods/processes as applicable described herein may be made without departing from the spirit of the invention. One skilled in the art will further appreciate that the invention may be used with many modifications of structure, arrangement, proportions, sizes, materials, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being defined by the appended claims and equivalents thereof, and not limited to the foregoing description or embodiments. Rather, the appended claims should be construed broadly, to include other variants and embodiments of the invention, which may be made by those skilled in the art without departing from the scope and range of equivalents of the invention.

What is claimed is:

1. A method for forming a film on a substrate, the method comprising:
    translating the substrate in a circular path through a plurality of process chambers of a material deposition apparatus, each process chamber containing a different source gas comprising a volatile reactive species;
    consecutively exposing the substrate to the process chambers in a sequential manner as the substrate translates in the circular path;
    forming a first film layer on the substrate at a first system pressure during a first period of time;
    forming a second film layer on the first film layer at a second system pressure during a second period of time, the second pressure being different than the first pressure;
    forming a boundary layer adjacent to the substrate beneath the process chambers; and
    mixing the source gases from each process chamber in the boundary layer;
    wherein the source gases are partially reacted when exposed to the substrate with each pass allowing the source gases including some unreacted gas to carry over in the boundary layer to the next succeeding chamber for reaction;
    wherein the film gradually grows in thickness on the substrate with each successive pass and exposure of the substrate to the volatile reactive species in the source gases of the process chambers; and
    wherein a thickness of the boundary layer is controlled by a plurality of separating barriers which isolates each of the process chambers from every other process chamber, the separating barriers each comprising a bottom edge which is spaced apart from a top surface of a heated susceptor supporting the substrate by a vertical separation distance, the separation distance setting a thickness of the boundary layer.

2. The method according to claim 1, wherein the step of forming the first film layer includes injecting the source gases into the process chambers at the first pressure, and the step of forming the second film layer includes injecting the source gases into the process chambers at the second pressure.

3. The method according to claim 2, wherein the sources gases are injected into the process chambers via a plurality of mass flow controllers, each process chamber having an associated mass flow controller.

4. The method according to claim 3, wherein pressure is changed between the first and second pressures in a dynamic manner while the substrate continues to translate in the circular path beneath the process chambers during a process run.

5. The method according to claim 3, wherein the source gases continue to be injected into the process chambers while the pressure transitions from the first pressure to the second pressure.

6. The method according to claim 3, wherein the pressure is changed between the first and second pressures via adjusting a pressure regulating valve fluidly coupled between each process chamber and one of the mass flow controllers associated with the process chamber.

7. The method according to claim 6, wherein the pressure is changed between the first and second pressures via simultaneously adjusting a plurality of the pressure regulating valves.

8. The method according to claim 7, wherein the pressure regulating valves are automatically adjusted via a programmable controller operably coupled to the pressure regulating valves.

9. The method according to claim 8, wherein for each pressure regulating valve, the programmable controller is configured to compare a measured actual pressure of the source gas downstream of the pressure regulating valve to a preprogrammed setpoint pressure, and adjust the pressure regulating valve until the actual pressure meets the setpoint pressure.

10. The method according to claim 1, wherein the film grows at higher growth rates at pressures greater than 1 atmosphere compared to growth rates at 1 atmosphere.

11. The method according to claim 10, further comprising growing a thickness of the first film layer on the substrate at the first pressure at a corresponding higher growth rate for the first period of time, and growing a thickness of the second film layer thinner than the first film layer at the second pressure at a corresponding lower growth rate for the second period of time, the first pressure being higher than the second pressure.

12. The method according to claim 11, wherein the first film layer has a different composition than the second film layer.

13. The method according to claim 1, wherein the substrate is exposed to cyclical pressure variations over time comprised of pressure waves of increasing and decreasing pressure in which pressure in the process chambers is alternated back and forth between the first and second pressures multiple times in succession.

14. The method according to claim 13, wherein the pressure waves follow a sawtooth pressure profile which form a corresponding sawtooth-shaped alloy composition profile in the film on the substrate.

15. The method according to claim 1, wherein the first period of time is different than the second period of time.

16. The method according to claim 1, wherein the first period of time is the same as the second period of time.

17. The method according to claim 1, wherein the thickness of the boundary layer is adjustable, and further comprising setting the boundary layer to a first thickness at the first pressure during the first period of time, and changing the boundary layer to a second thickness at the second pressure for the second period of time, the first thickness being different than the second thickness.

18. The method according to claim 1, wherein the reactive species in each process chamber is different than the reactive species in every other process chamber.

19. The method according to claim 1, wherein the source gases in each process chamber is fluidly isolated from the source gases in every other chamber, and wherein each process chamber is fluidly coupled to a discrete gas source fluidly isolated from every other gas source upstream of the material deposition apparatus to prevent premixing of the source gases upstream of the process chambers.

* * * * *